(12) United States Patent
Lai

(10) Patent No.: US 9,362,302 B1
(45) Date of Patent: Jun. 7, 2016

(54) SOURCE LINE FORMATION IN 3D VERTICAL CHANNEL AND MEMORY

(71) Applicant: MACRONIX INTERNATIONAL CO., LTD., Hsinchu (TW)

(72) Inventor: Erh-Kun Lai, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/608,053

(22) Filed: Jan. 28, 2015

(51) Int. Cl.
*G11C 16/04* (2006.01)
*H01L 27/115* (2006.01)
*G11C 16/28* (2006.01)
*H01L 29/06* (2006.01)
*H01L 29/45* (2006.01)
*H01L 21/311* (2006.01)
*H01L 21/3213* (2006.01)
*H01L 21/28* (2006.01)

(52) U.S. Cl.
CPC ...... *H01L 27/11582* (2013.01); *G11C 16/0466* (2013.01); *G11C 16/0483* (2013.01); *G11C 16/28* (2013.01); *H01L 21/28282* (2013.01); *H01L 21/31111* (2013.01); *H01L 21/32133* (2013.01); *H01L 29/0642* (2013.01); *H01L 29/0688* (2013.01); *H01L 29/456* (2013.01)

(58) Field of Classification Search
CPC ...... H01L 27/11582; H01L 29/0642; H01L 21/31111; H01L 29/456; H01L 21/28282; H01L 21/32133; H01L 29/0688; G11C 16/0483; G11C 16/0466; G11C 16/28
See application file for complete search history.

(56) References Cited

U.S. PATENT DOCUMENTS

2011/0286283 A1* 11/2011 Lung .................. G11C 16/0483 365/185.28
2012/0049267 A1* 3/2012 Jung ................. H01L 27/11578 257/324
2012/0211823 A1* 8/2012 Lim .................. H01L 27/11565 257/326
2015/0004763 A1* 1/2015 Lue .................... H01L 27/11524 438/257
2015/0318299 A1* 11/2015 Lai .................... H01L 27/11582 257/325
2015/0371998 A1* 12/2015 Lue ...................... H01L 29/792 257/326

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.
U.S. Appl. No. 14/309,622, entitled "Bandgap-engineered Memory With Multiple Charge Trapping Layers Storing Charge," by Hang-Ting Lue, filed Jun. 19, 2014, 108 pages.

* cited by examiner

*Primary Examiner* — Khamdan Alrobaie
(74) *Attorney, Agent, or Firm* — Yiding Wu; Haynes Beffel & Wolfeld LLP

(57) ABSTRACT

A memory device includes a plurality of stacks of conductive strips separated by insulating material, including at least a bottom level of conductive strips, a plurality of intermediate levels of conductive strips, and a top level of conductive strips. A reference conductor is disposed in a level between the bottom level of conductive strips and a substrate, isolated from the substrate by a layer of insulating material, and isolated from the bottom level by another layer of insulating material. A plurality of vertical active strips is disposed between the plurality of stacks in electrical contact with the substrate, and with the reference conductor. Charge storage structures are disposed in interface regions at cross-points between side surfaces of the conductive strips in the plurality of intermediate levels and the vertical active strips. A bias circuit is configured to provide different bias arrangements to the reference conductor and the substrate.

17 Claims, 35 Drawing Sheets

SOURCE LINE FORMATION IN 3D VERTICAL CHANNEL AND MEMORY

BACKGROUND

1. Field of the Technology

The present technology relates to high density memory devices, and particularly to memory devices in which multiple levels of memory cells are arranged to provide a three-dimensional (3D) array.

2. Description of Related Art 3D memory devices have been developed in a variety of configurations that include stacks of conductive strips separated by insulating material, and vertical active strips between the stacks. Memory cells including charge storage structures are disposed at interface regions between levels of conductive strips in the stacks and the vertical active strips. In a 3D memory architecture, such as *Samsung*, pp., 192-193, *VLSI Tech*. 2009, a word line cut is etched through a stack of conductive strips between adjacent channel poly plugs, and a common source line (CSL) for stacks of conductive strips is then formed by N type implantation into a P type substrate through the word line cut (FIG. 5a). However, the junction profile between the N type implantation and the P type substrate is difficult to control, and the relatively low doping concentration in the implantation tends to increase the resistance of the common source line thus formed.

It is desirable to provide a technology for three-dimensional integrated circuit memory that provides a common source line with lower resistance, and can have improved junction profiles between the common source line and the substrate.

SUMMARY

A memory device includes a substrate and a plurality of stacks of conductive strips separated by insulating material. A reference conductor is disposed in a level between the plurality of stacks of conductive strips and the substrate, isolated from the substrate by a layer of insulating material, and isolated from the plurality of stacks of conductive strips by another layer of insulating material. A plurality of vertical active strips is disposed between the plurality of stacks in electrical contact with the substrate, and with the reference conductor. PN junctions can be formed at interface regions between the vertical active strips and the substrate where the vertical active strips are in electrical contact with the substrate. Charge storage structures are disposed in interface regions at cross-points between side surfaces of the conductive strips in the plurality of stacks of conductive strips and the vertical active strips in the plurality of vertical active strips.

The substrate can be an isolated well. The memory device can include a bias circuit connected to the reference conductor, the isolated well, the conductive strips in the stacks of conductive strips, and the vertical active strips in the plurality of vertical active strips. The bias circuit can be configured to provide different bias arrangements to the reference conductor and the substrate. The substrate can include P type semiconductor material, and the reference conductor can include N type semiconductor material.

A vertical conductive element can be connected to the reference conductor, where the vertical conductive element is arranged orthogonally to and insulated from the plurality of stacks of conductive strips.

The memory device can include a silicide layer on side surfaces of the conductive strips in at least one of a top level of conductive strips and a bottom level of conductive strips in the plurality of stacks, and/or on a top surface of the reference conductor.

Methods for manufacturing memory devices as described herein are also provided.

Other aspects and advantages of the present technology can be seen on review of the drawings, the detailed description and the claims, which follow.

DETAILED DESCRIPTION

Figure 1:
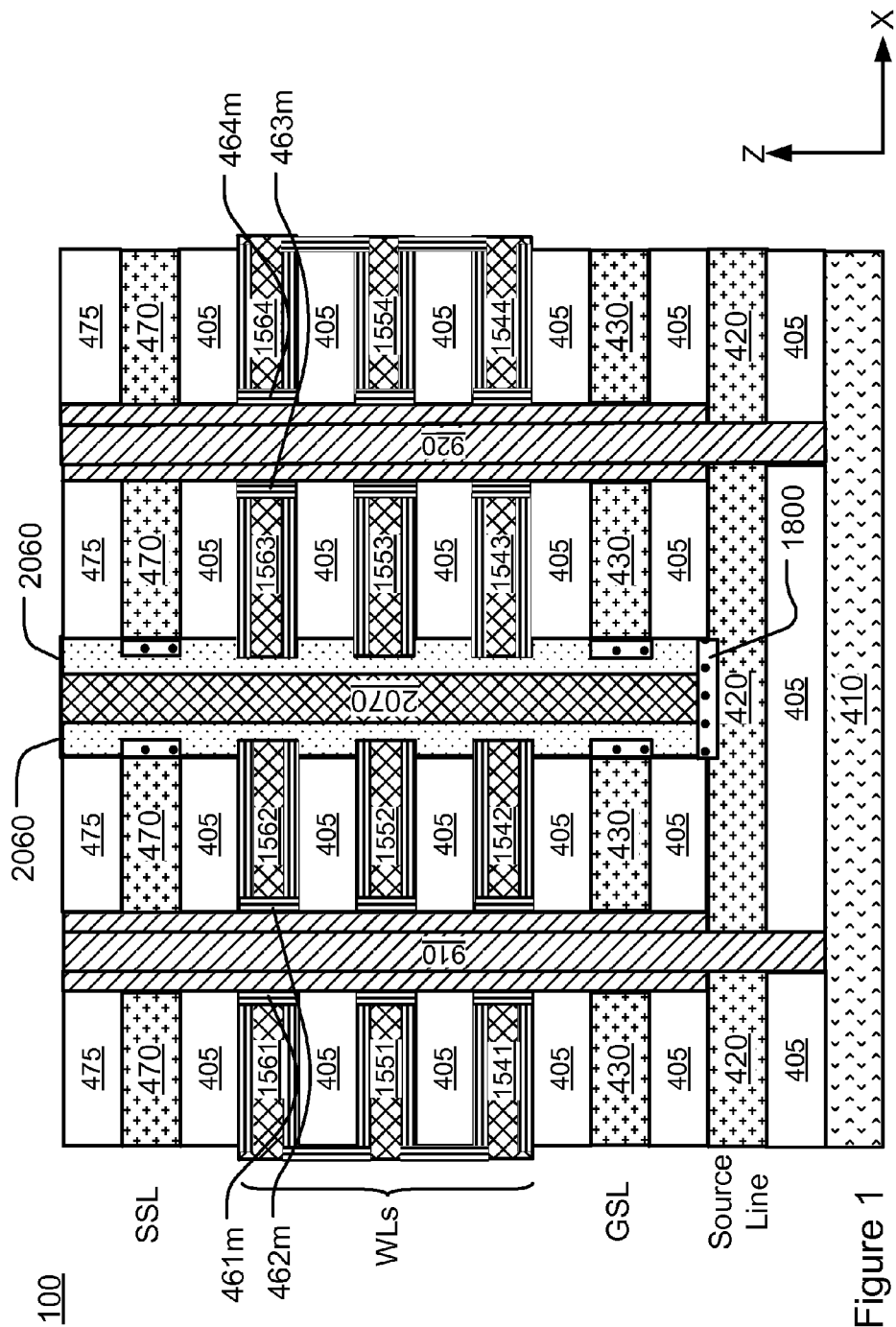
FIG. 1 is a cross-sectional diagram of a 3D memory device according to an embodiment of the present technology.

A detailed description of embodiments of the present technology is provided with reference to the Figures. The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a cross-sectional diagram of a 3D memory device according to an embodiment of the present technology, shown in an X-Z plane. As illustrated in the example of FIG. 1, a memory device 100 includes a substrate (e.g. 410) and a plurality of stacks of conductive strips separated by insulating material (e.g. 405), including at least a bottom level of conductive strips (e.g. 430), a plurality of intermediate levels of conductive strips (e.g. 1541-1544, 1551-1554, 1561-1564), and a top level of conductive strips (e.g. 470). A reference conductor (e.g. 420) is disposed in a level between the plurality of stacks of conductive strips and the substrate, isolated from the substrate by a layer of insulating material, and isolated from the plurality of stacks of conductive strips by another layer of insulating material. A plurality of vertical active strips (e.g. 910, 920) is disposed between the plurality of stacks in electrical contact with the substrate, and with the reference conductor. Charge storage structures (e.g. 461*m*, 462*m*, 463*m* 464*m*) are disposed in interface regions at cross-points between side surfaces of the conductive strips in the plurality of stacks of conductive strips and the vertical active strips in the plurality of vertical active strips.

A vertical conductive element (e.g. 2070) can be connected to the reference conductor (e.g. 420), where the vertical conductive element is arranged orthogonally to and insulated from the plurality of stacks of conductive strips by spacers (e.g. 2060). The memory device can include a silicide layer (e.g. 1800) on side surfaces of the conductive strips in at least one of the top level of conductive strips (e.g. 470) and the bottom level of conductive strips (e.g. 430) in the plurality of stacks, and/or on a top surface of the reference conductor.

The conductive strips in the plurality of stacks of conductive strips are disposed in a Y direction perpendicular to the X-Z plane, and are connected to decoding circuitry in the memory device. The memory device can include an overlying patterned conductive layer (not shown) connected to the plurality of vertical active strips, including a plurality of global bit lines coupled to sensing circuits.

Figure 2:
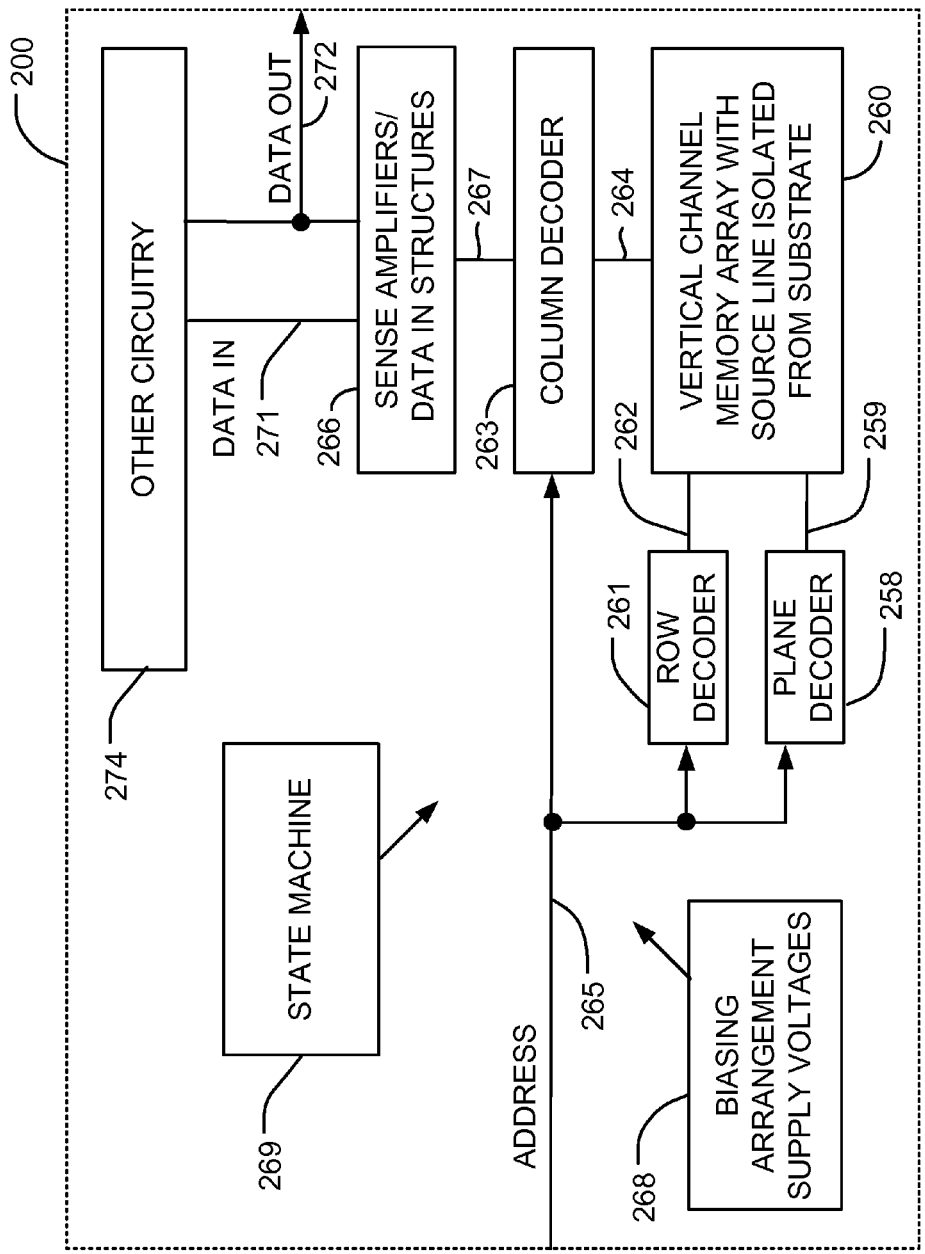
FIG. 2 is a simplified block diagram of an integrated circuit according to an embodiment of the present technology.

FIG. 2 is a simplified block diagram of an integrated circuit according to an embodiment of the present technology. In the example shown in FIG. 2, the integrated circuit 200 includes a vertical channel memory array of strings of memory cells (e.g. 260). The integrated circuit 200 includes a plurality of stacks of conductive strips separated by insulating material, including at least a bottom level of conductive strips, a plurality of intermediate levels of conductive strips, and a top level of conductive strips. A reference conductor is disposed in a level between the bottom level of conductive strips and the substrate, isolated from the substrate by a layer of insulating material, and isolated from the bottom level by another layer of insulating material. A plurality of vertical active strips is disposed between the plurality of stacks in electrical contact with the substrate, and with the reference conductor. Charge storage structures are disposed in interface regions at cross-points between side surfaces of the conductive strips in the plurality of intermediate levels in the stacks and the vertical active strips in the plurality of vertical active strips.

A row decoder 261 is coupled to a plurality of word lines 262, and arranged along rows in the memory array 260. A column decoder 263 is coupled to a plurality of bit lines 264 arranged along columns in the memory array 260 for reading and programming data from the memory cells in the memory array 260. A plane decoder 258 is coupled to a plurality of levels in the memory array 260 on SSL lines 259. Addresses are supplied on bus 265 to column decoder 263, row decoder 261 and plane decoder 258. Sense amplifiers and data-in structures in block 266 are coupled to the column decoder 263 in this example via data bus 267. Data is supplied via the data-in line 271 from input/output ports on the integrated circuit 200 or from other data sources internal or external to the integrated circuit 200, to the data-in structures in block 266. In the illustrated embodiment, other circuitry 274 is included on the integrated circuit, such as a general purpose processor or special purpose application circuitry, or a combination of modules providing system-on-a-chip functionality supported by the programmable resistance cell array. Data is supplied via the data-out line 272 from the sense amplifiers in block 266 to input/output ports on the integrated circuit 200, or to other data destinations internal or external to the integrated circuit 200.

A controller implemented in this example using bias arrangement state machine 269 controls the application of bias arrangement supply voltage generated or provided through the voltage supply or supplies in bias circuit 268, such as program, read and erase voltages. The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

Figure 3:
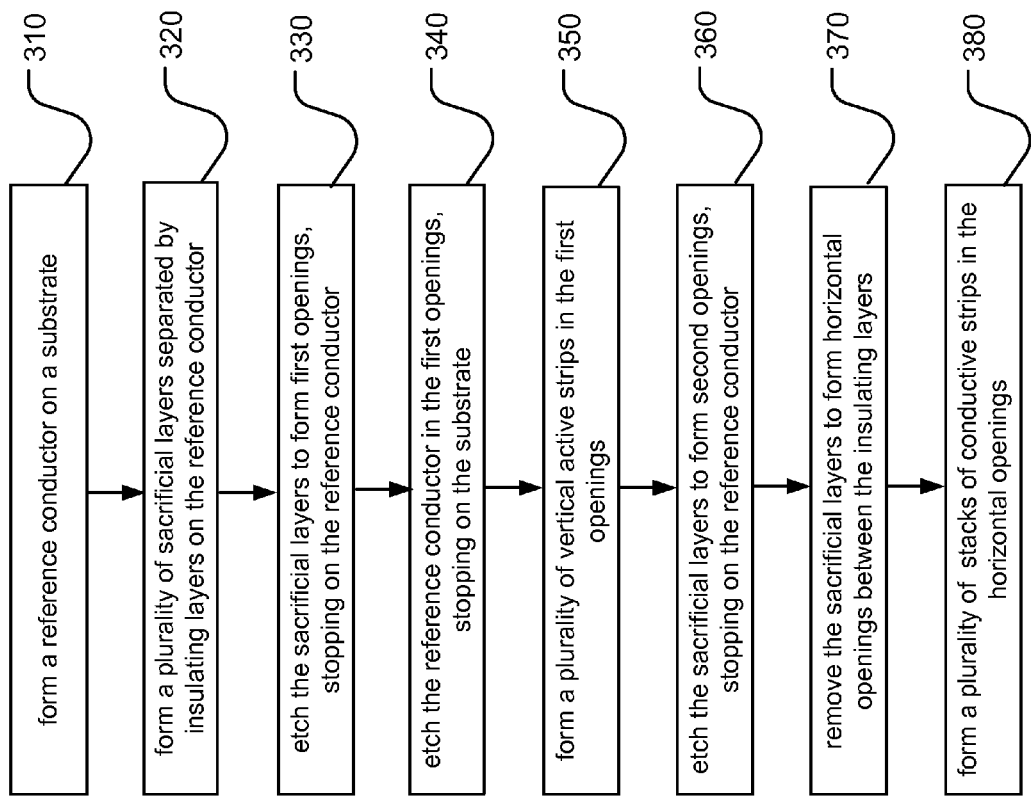
FIG. 3 is a flow chart illustrating a method for manufacturing a memory device.

FIG. 3 is a flow chart illustrating a method for manufacturing a vertical channel structure. The method begins with forming a reference conductor on a substrate, where the reference conductor is isolated from the substrate by a layer of insulating material (Step 310). In one implementation, the substrate includes P type semiconductor material and the reference conductor includes N type semiconductor material. A plurality of sacrificial layers separated by insulating layers is formed on the reference conductor (Step 320). The sacrificial layers are etched to form first openings, stopping on the reference conductor (Step 330). The reference conductor is etched in the first openings, stopping on the substrate (Step 340). A plurality of vertical active strips is then formed in the first openings, where vertical active strips in the plurality of vertical active strips are in electrical contact with the substrate and with the reference conductor (Step 350). The sacrificial layers are etched to form second openings between adjacent vertical active strips in the plurality of vertical active strips, stopping on the reference conductor, thereby exposing the plurality of sacrificial layers (Step 360). The plurality of sacrificial layers exposed by the second openings is removed to form horizontal openings between the insulating layers (Step 370). A plurality of stacks of conductive strips is formed in the horizontal openings (Step 380).

The method can include forming spacers on side surfaces in the second openings, and filling the second openings with conductive material to form vertical conductive elements connected to the reference conductor.

The method can further include forming a bias circuit connected to the reference conductor, the substrate, the conductive strips in the stacks of conductive strips, and the vertical active strips in the plurality of vertical active strips, the bias circuit configured to provide different bias arrangements to the reference conductor and the substrate.

Step 320 can include forming at least one of a top conductive layer above the plurality of sacrificial layers and a bottom conductive layer between the plurality of sacrificial layers and the reference conductor, separated by insulating layers. Step 330 can include etching the at least one of a top conductive layer and the bottom conductive layer to form first openings.

In one implementation, a gate dielectric layer can be formed on side surfaces of the at least one of the top conductive layer and the bottom conductive layer in the first openings, and on the reference conductor in the first openings. Spacers can then be formed on side surfaces of the sacrificial layers and on the gate dielectric layer on side surfaces of the at least one of the top conductive layer and the bottom conductive layer, prior to etching the reference conductor in the first openings.

A memory layer can be formed on the spacers in the horizontal openings, prior to forming a plurality of stacks of conductive strips in the horizontal openings, wherein side surfaces of conductive strips in the plurality of stacks contact the memory layer. A silicide layer can be formed on side surfaces of the at least one of the top conductive layer and the bottom conductive layer in the second openings, and on a top surface of the reference conductor in the second openings.

The gate dielectric layer can have a different composition than the memory layer. The gate dielectric layer can include silicon oxide. The memory layer can include a multilayer dielectric charge storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon). In other embodiments the memory layer can be a dielectric charge trapping structure such as described in our co-pending, and commonly owned, U.S. patent application Ser. No. 14/309,622, entitled BAND-GAP-ENGINEERED MEMORY WITH MULTIPLE CHARGE TRAPPING LAYERS STORING CHARGE, by H. T. Lue, which application is incorporated by reference as if fully set forth herein.

In another implementation, a memory layer can be formed on side surfaces of the sacrificial layers in the first openings, and spacers can be formed on the memory layer in the first openings, prior to etching the reference conductor in the first openings, where side surfaces of conductive strips in the plurality of stacks contact the memory layer.

Figure 4:
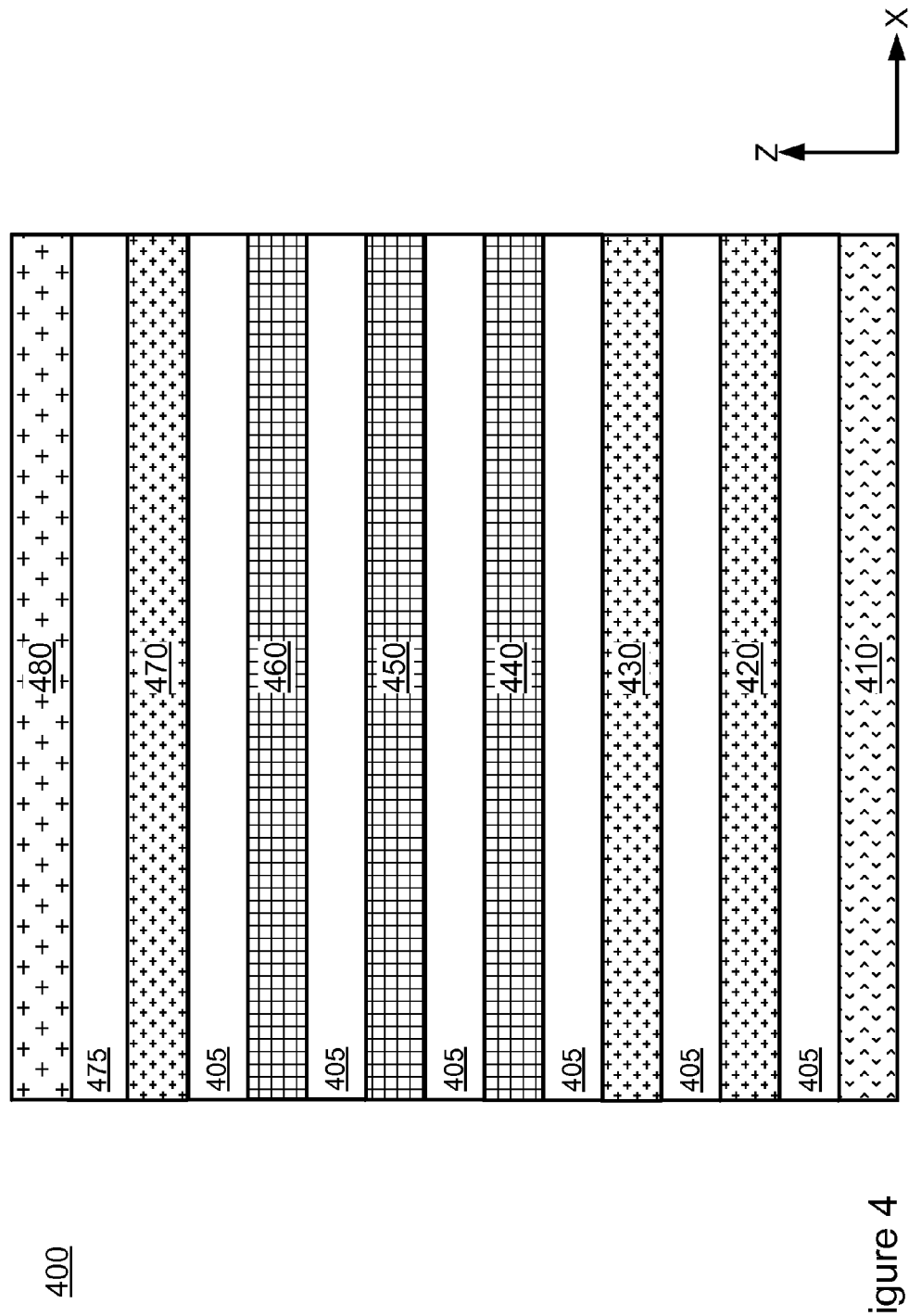
FIGS. 4 through 16 illustrate an example process flow for manufacturing a memory device.

FIGS. 4 through 16 illustrate an example process flow for manufacturing a memory device. FIG. 4 illustrates a cross-section in the X-Z plane of a partially fabricated memory device. In the example shown in FIG. 4, a memory device 400 includes a reference conductor (e.g. 420) on a substrate (e.g. 410), isolated from the substrate by a layer of insulating material (e.g. 405). The memory device includes a plurality of sacrificial layers (e.g. 440, 450 and 460) for forming word lines (WLs), a top conductive layer (e.g. 470) above the plurality of sacrificial layers for forming string select lines (SSL), and a bottom conductive layer (e.g. 430) between the plurality of sacrificial layers and the reference conductor for forming ground select lines (GSL). The sacrificial and conductive layers are separated by insulating layers (e.g. 405). A hard mask (e.g. 480) is disposed on the sacrificial and conductive layers for patterning the sacrificial and conductive layers, and separated from the top conductive layer (e.g. 470) by a layer of insulating material (e.g. 475).

The hard mask (e.g. 480) and the plurality of sacrificial layers (e.g. 440, 450 and 460) can include silicon nitride. The top conductive layer (e.g. 470), the bottom conductive layer (e.g. 430), and the reference conductor (e.g. 420) can include N type semiconductor material. The substrate (e.g. 410) can include P type semiconductor material.

Figure 5:
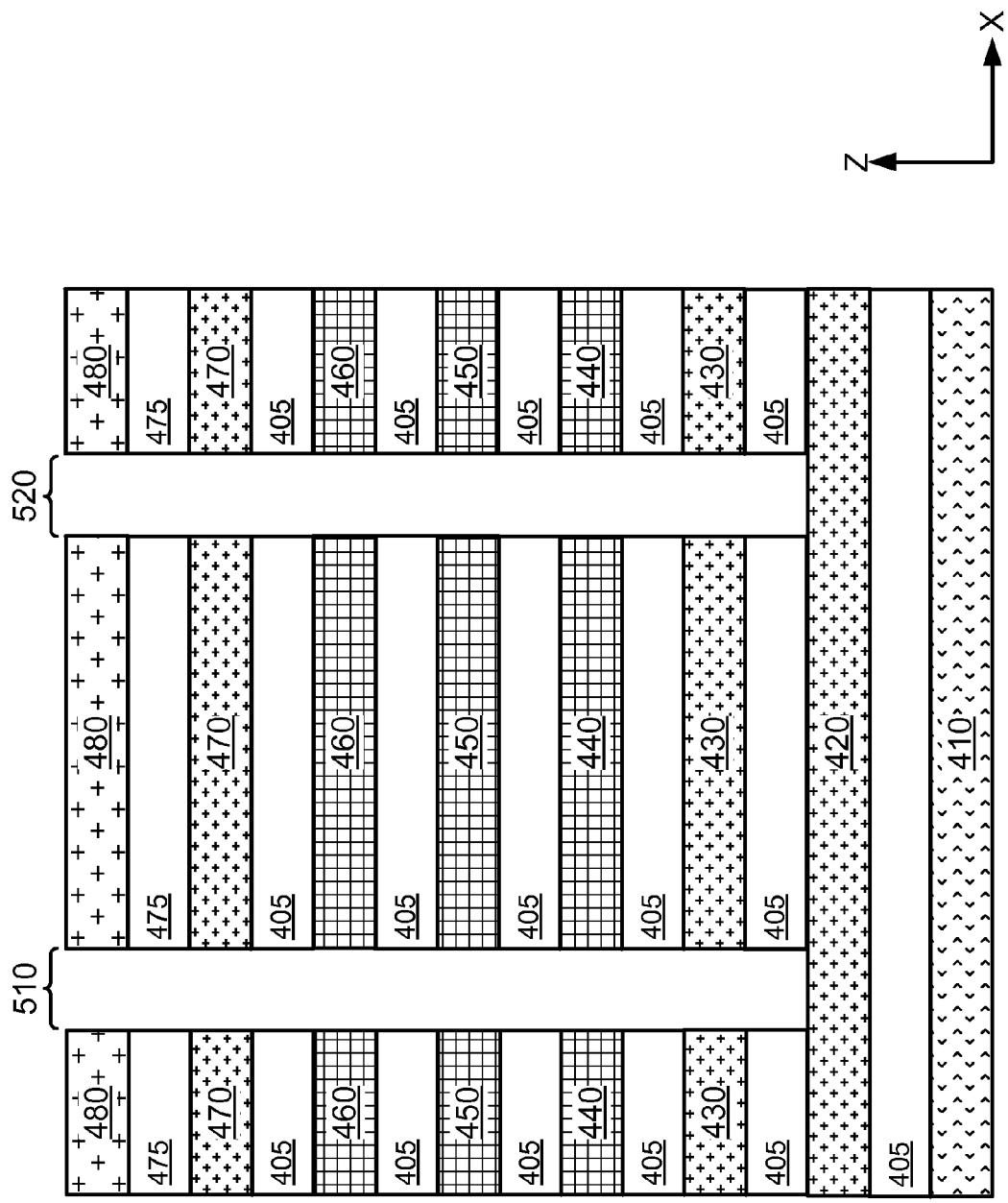

FIG. 5 illustrates a stage in the example process after etching the sacrificial and conductive layers to form first openings (e.g. 510, 520), stopping on the reference conductor (e.g. 420). For instance, the sacrificial and conductive layers can be etched with RIE (reactive ion etching). The first openings are etched through the plurality of sacrificial layers (e.g. 440, 450 and 460), the top conductive layer (470), and the bottom conductive layer (430). The first openings can be used to form a plurality of vertical active strips.

Figure 6:
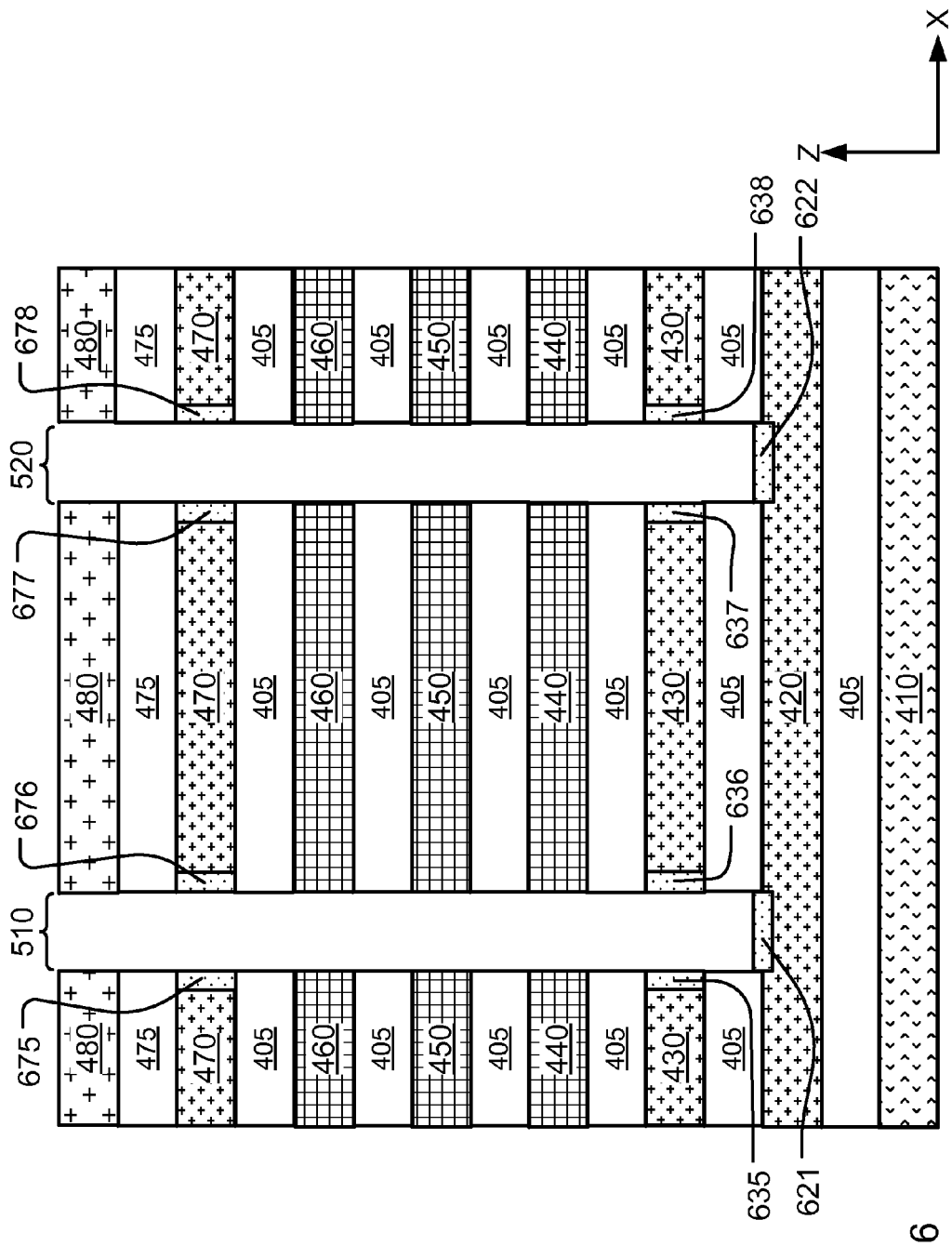

FIG. 6 illustrates a stage in the process after forming a gate dielectric layer on side surfaces of the top conductive layer (e.g. 675, 676, 677, 678), and on side surfaces of the bottom conductive layer (e.g. 635, 636, 637, 638) in the first openings (e.g. 510, 520). The gate dielectric layer can include a layer of silicon oxide material. The gate dielectric layer can have a thickness of about seven (7) nanometers. For instance, the layer of silicon oxide material can be formed by thermal oxidation on the top conductive layer (e.g. 470) and the bottom conductive layer (e.g. 430) at a range of temperature between 800° C.-900° C. As a result of the thermal oxidation, the layer of silicon oxide material (e.g. 621, 622) also forms on the reference conductor 420 in the first openings (e.g. 510, 520). The layer of silicon oxide material does not form on the plurality of sacrificial layers (e.g. 440, 450 and 460) or the hard mask (e.g. 480).

Figure 7:
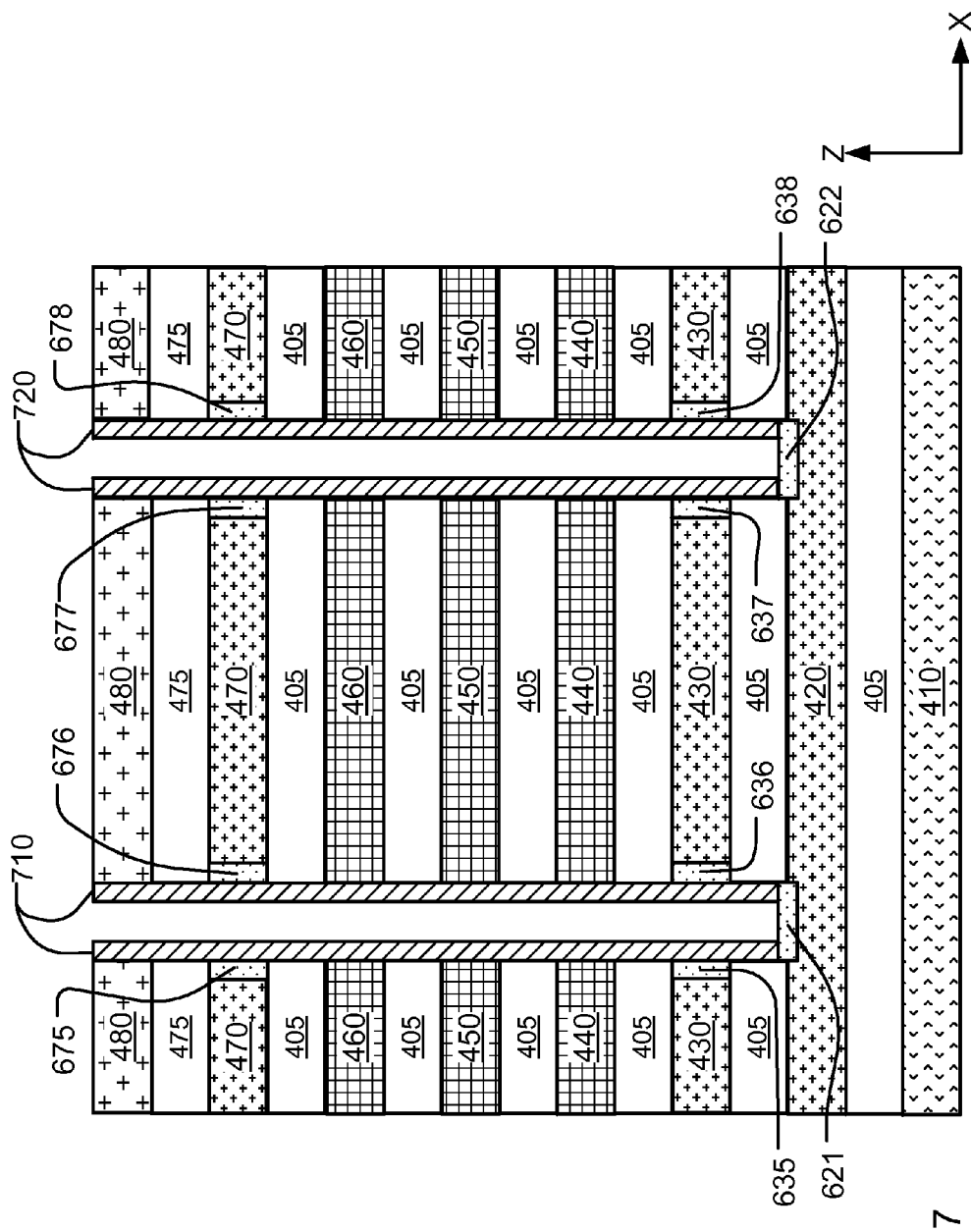

FIG. 7 illustrates a stage in the process after forming spacers (e.g. 710, 720) on side surfaces of the sacrificial layers and the hard mask, and on the gate dielectric layer on side surfaces of the at least one of the top conductive layer and the bottom conductive layer, in the first openings. The sacrificial layers and the hard mask can include silicon nitride. The spacers can include P type or intrinsic semiconductor material, and can become part of the channel regions for memory cells formed in the memory device.

Figure 8:
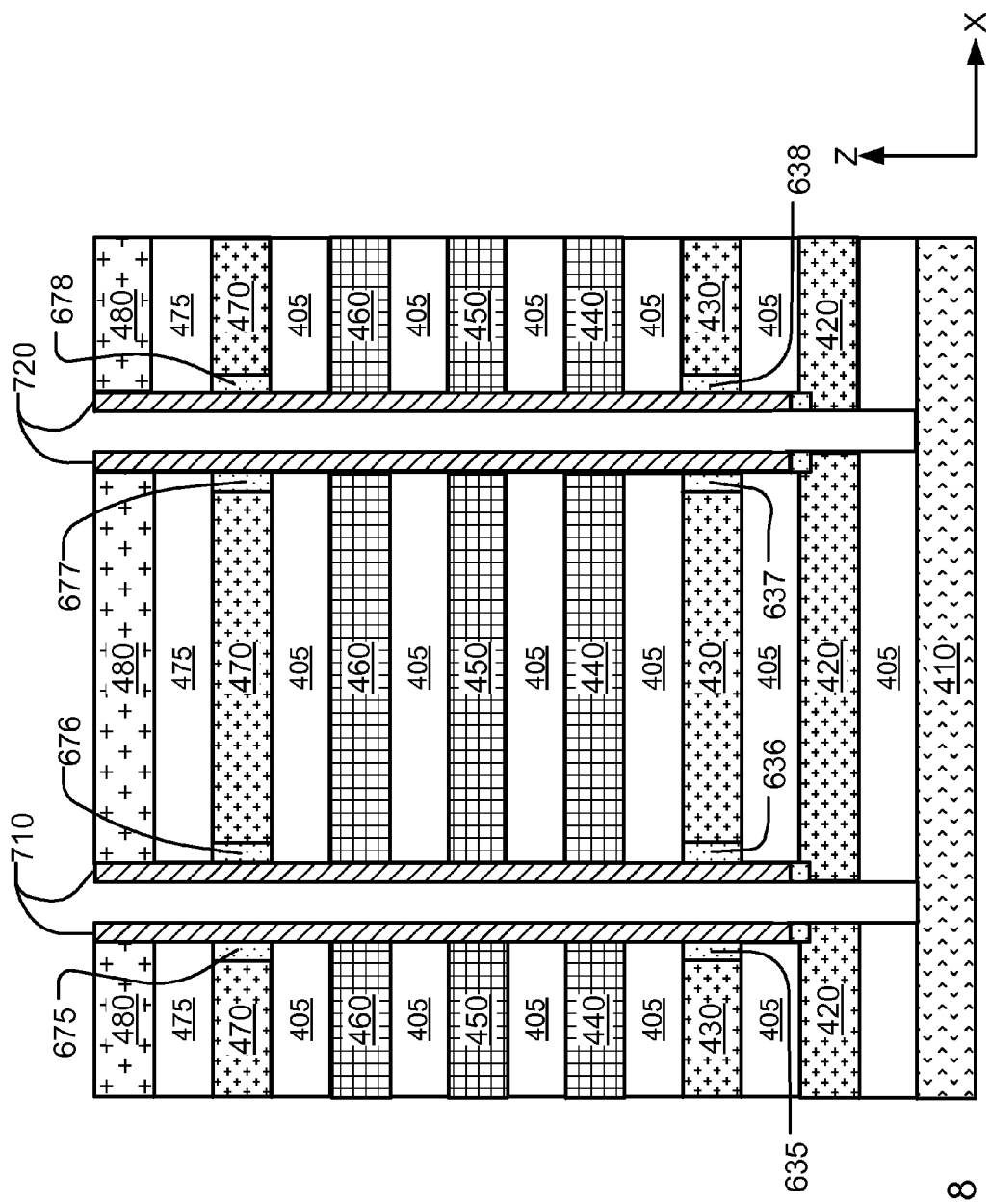

FIG. 8 illustrates a stage in the process after etching the layer of silicon oxide material (e.g. 621, 622) on the reference conductor, the reference conductor (e.g. 420), and a layer of insulating material (e.g. 405) between the reference conductor and the substrate in the first openings, stopping on the substrate (e.g. 410).

Figure 9:
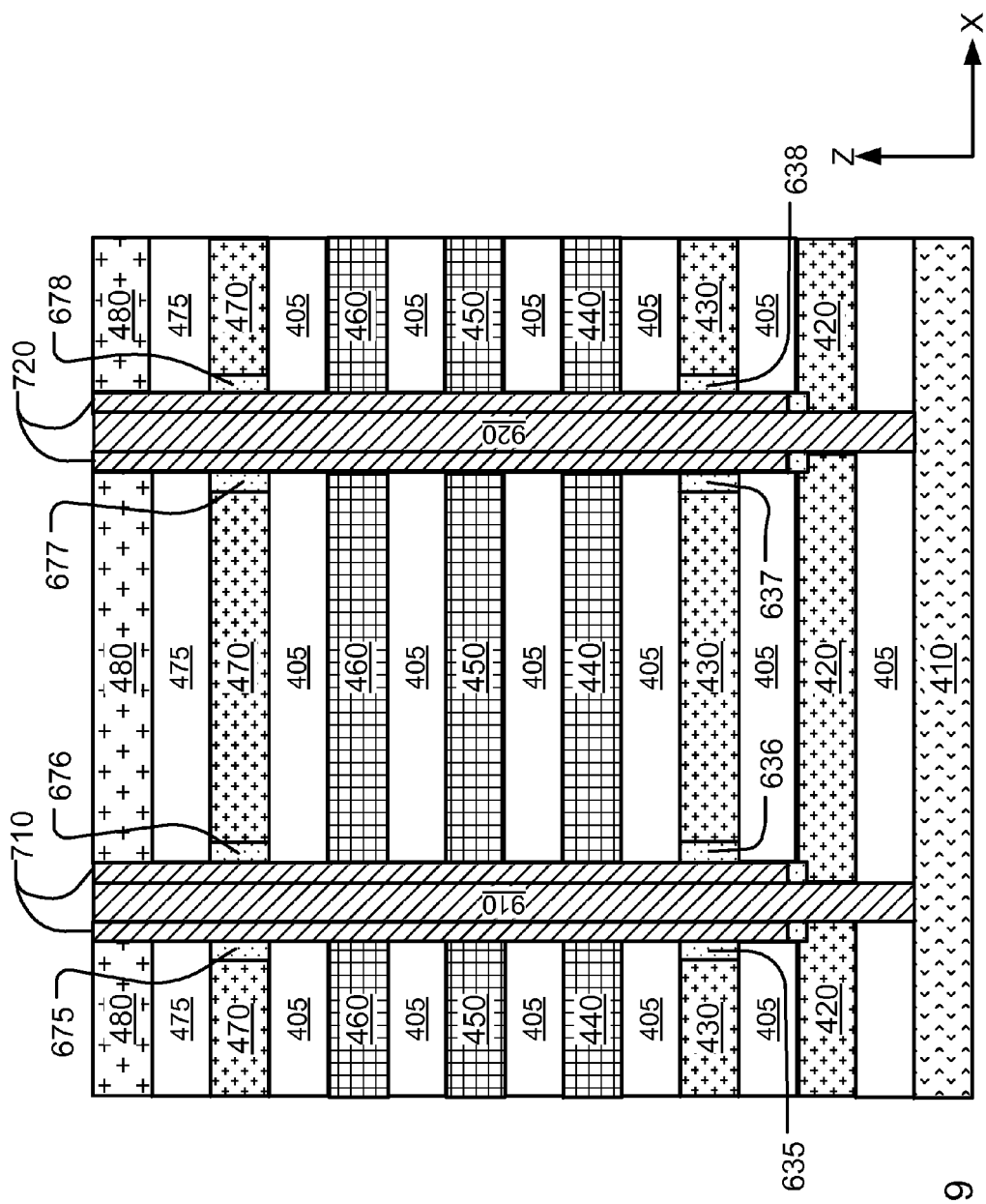
Figure 9A:
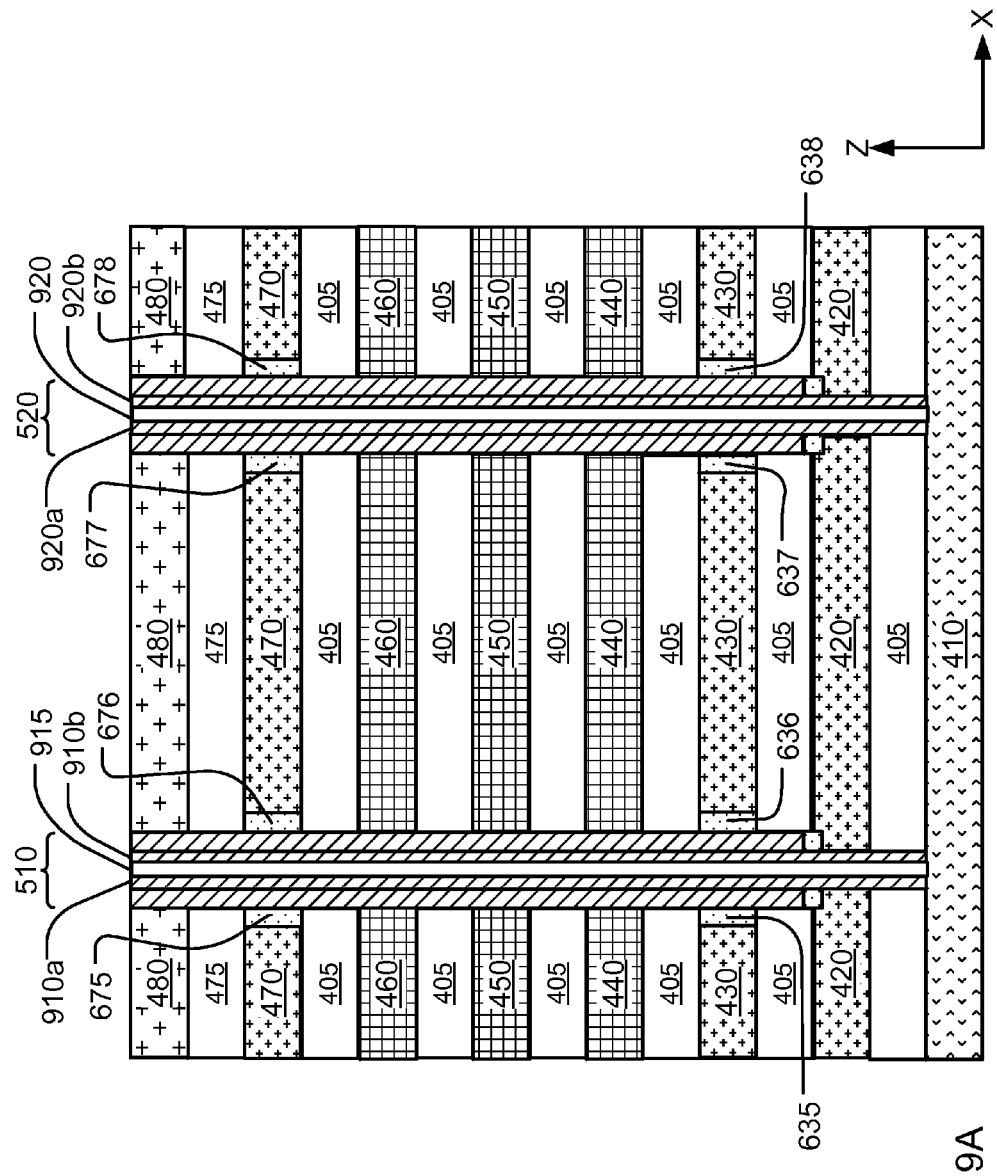

FIG. 9 illustrates a stage in the process after forming a plurality of vertical active strips (e.g. 910, 920) in the first openings. The vertical active strips are in electrical contact with the substrate (e.g. 410) and with the reference conductor (e.g. 420). In an alternative embodiment, as shown in the example of FIG. 9A, a vertical channel structure can be implemented in a "macaroni" style, where an air gap or a seam (e.g. 915, 925) can be formed between a left vertical active strip (e.g. 910a, 920a) and a right vertical active strip (e.g. 910b, 920b) inside a first opening (e.g. 510, 520). The air gap or seam can suppress channel to channel coupling that can cause Z-direction disturb in 3D vertical channel structures.

Figure 10:
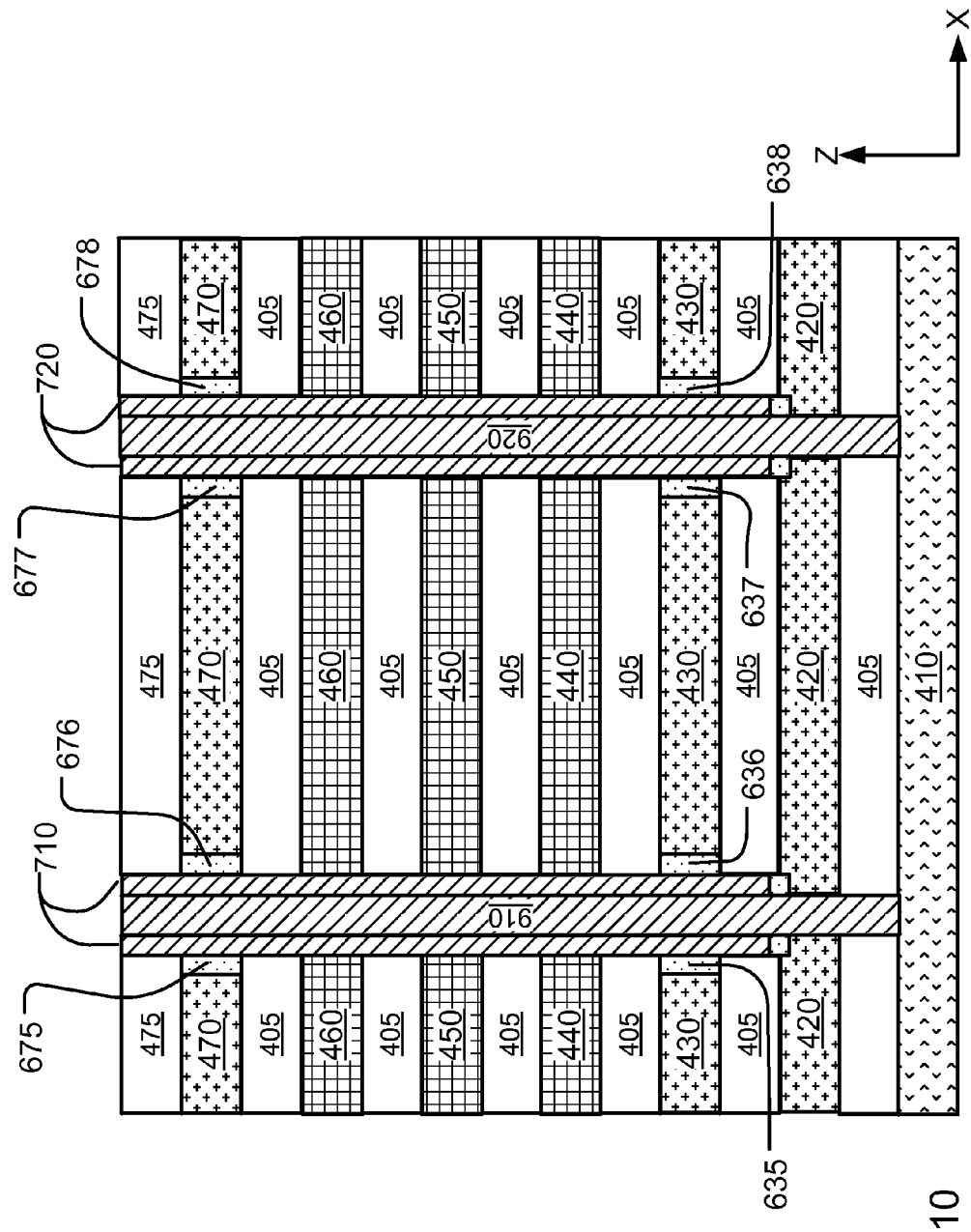

FIG. 10 illustrates a stage in the process after removing the hard mask (e.g. 480), for instance using CMP (chemical-mechanical-planarization), stopping at an insulation layer (e.g. 475) below the hard mask.

Figure 11:
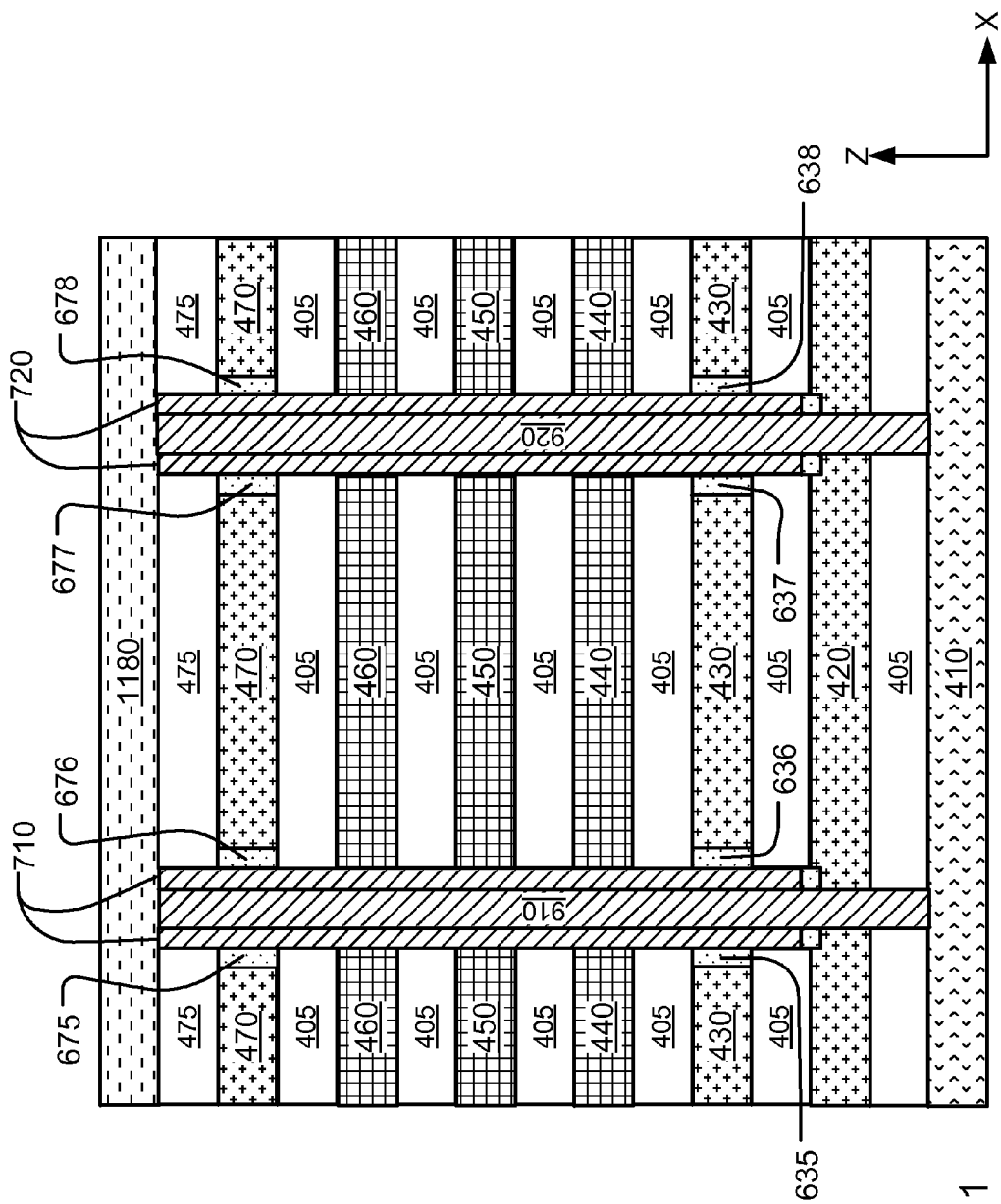

FIG. 11 illustrates a stage in the process after depositing a layer of insulating material (e.g. 1180), such as an oxide material, to protect the plurality of vertical active strips (e.g. 910, 920) and the spacers in the first openings (e.g. 710, 720) from subsequent patterning steps, where the vertical active strips and spacers can form parts of the channel regions for memory cells in the memory device.

Figure 12:
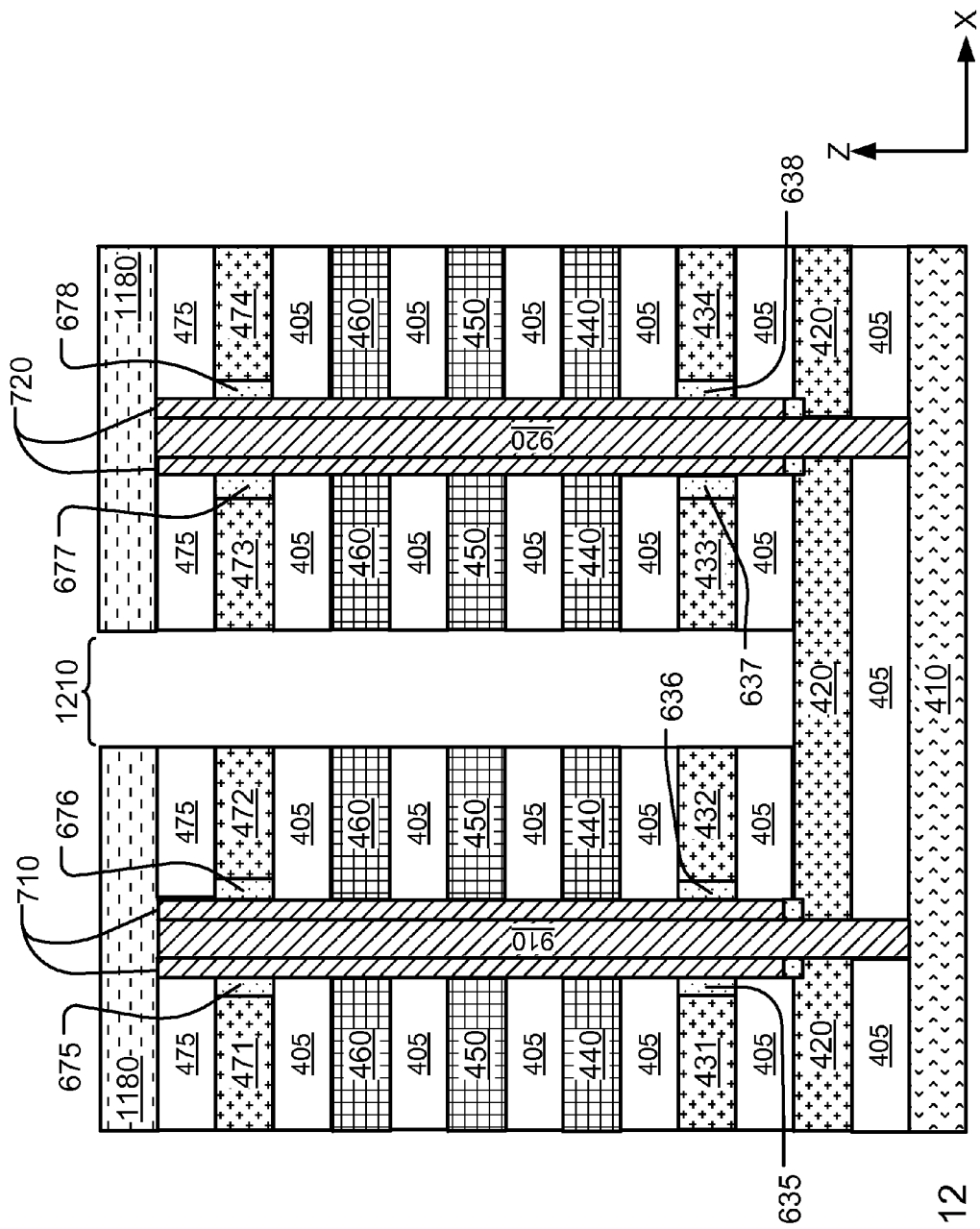

FIG. 12 illustrates a stage in the process after etching the sacrificial and conductive layers to form second openings (e.g. 1210) between adjacent vertical active strips (e.g. 910, 920) in the plurality of vertical active strips, stopping on the reference conductor (e.g. 420). The plurality of sacrificial layers (e.g. 440, 450, 460) is exposed by the second openings. A top level of conductive strips (e.g. 471-474), and a bottom level of conductive strips (e.g. 431-434) are formed, where conductive strips in the top level and the bottom level contact the gate dielectric layer (e.g. 675-678, 635-638). Conductive strips in the top level and in the bottom level are in a Y direction perpendicular to the X-Z plane.

Figure 13:
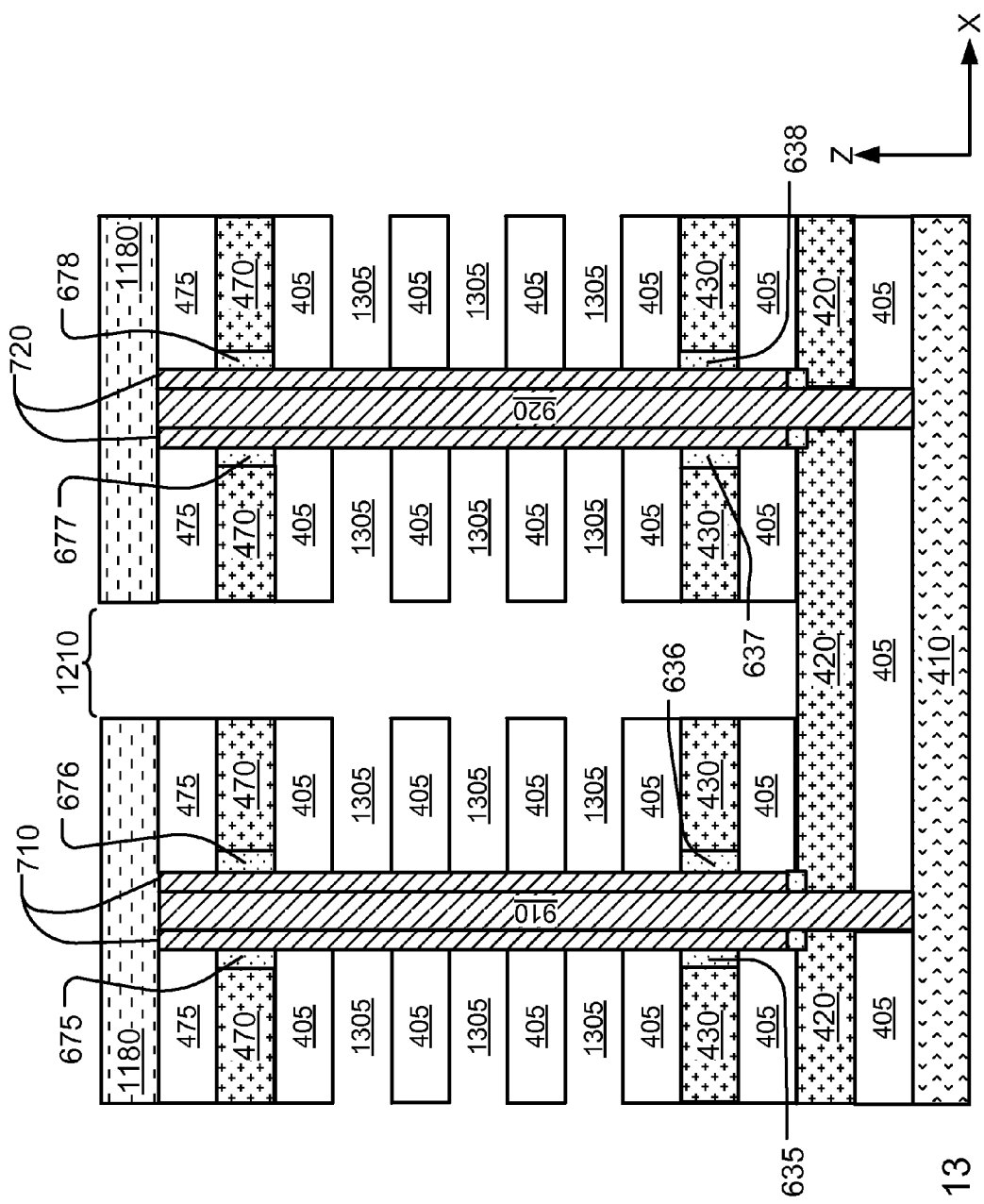

FIG. 13 illustrates a stage in the process after removing the plurality of sacrificial layers exposed by the second openings to form horizontal openings (e.g. 1305) between the insulating layers (e.g. 405). This stage in the process leaves the insulating layers adhered to the spacers (e.g. 710, 720), with horizontal openings (e.g. 1305) in between. Horizontal openings 1305 can be used for forming word lines (WLs). The plurality of sacrificial layers can be removed by an etching process using phosphoric acid (H3PO4) as an etchant. Phosphoric acid (H3PO4) is highly selective to the silicon nitride material used in the sacrificial layers, to the oxide material used in the insulation layers, and to the N+ poly silicon material used in the top conductive layer and in the bottom conductive layer.

Figure 14:
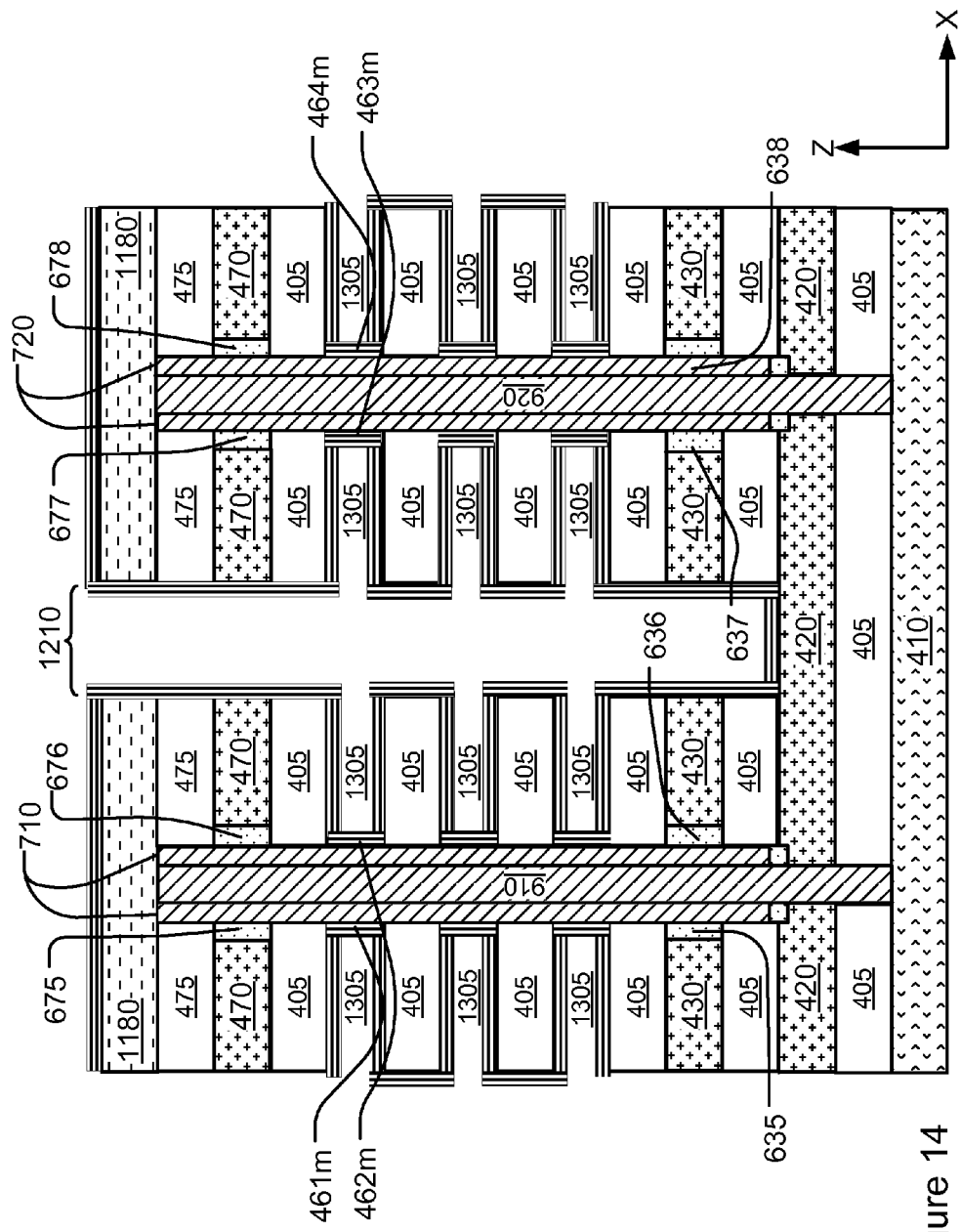

FIG. 14 illustrates a stage in the process after forming a memory layer (e.g. 461m, 462m, 463m, 464m) on the spacers (e.g. 710, 720) in the horizontal openings. The memory layer can include a multilayer dielectric charge storage structure, known from flash memory technologies, including a tunneling layer, a trapping layer, and a blocking layer. The memory layer can include for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

Figure 15:
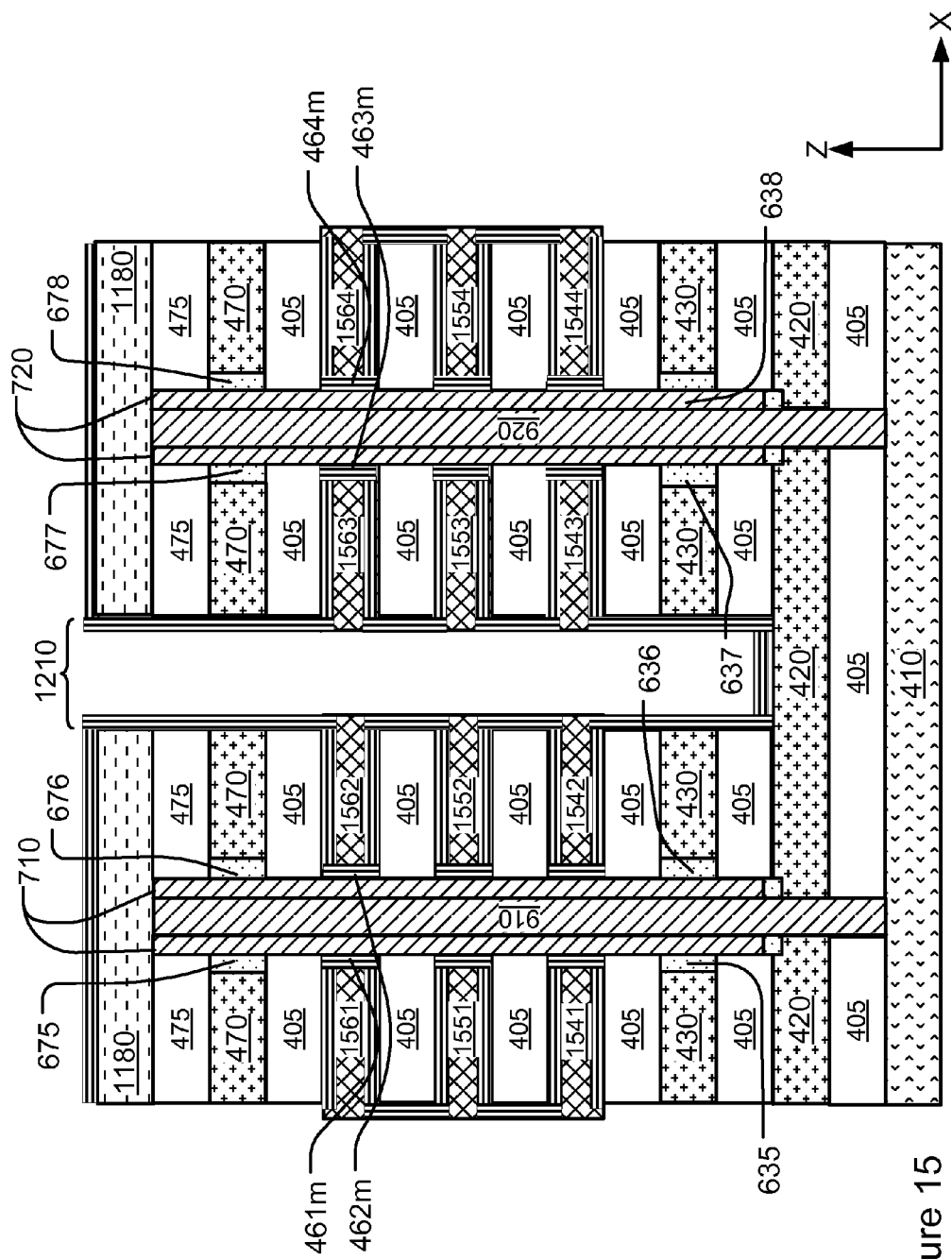

FIG. 15 illustrates a stage in the process after depositing a conductive material over the memory layer, through the second openings (e.g. 1210), to form a plurality of stacks of conductive strips in the horizontal openings (e.g. 1541-1544, 1551-1554, 1561-1564). The conductive material can include Ti (titanium), TiN (titanium nitride), Ta (tantalum), TaN (tantalum nitride), W (tungsten) and Cu (copper). Side surfaces of conductive strips in the plurality of stacks contact the memory layer. Conductive strips in the plurality of stacks are in a Y direction perpendicular to the X-Z plane.

Figure 16:
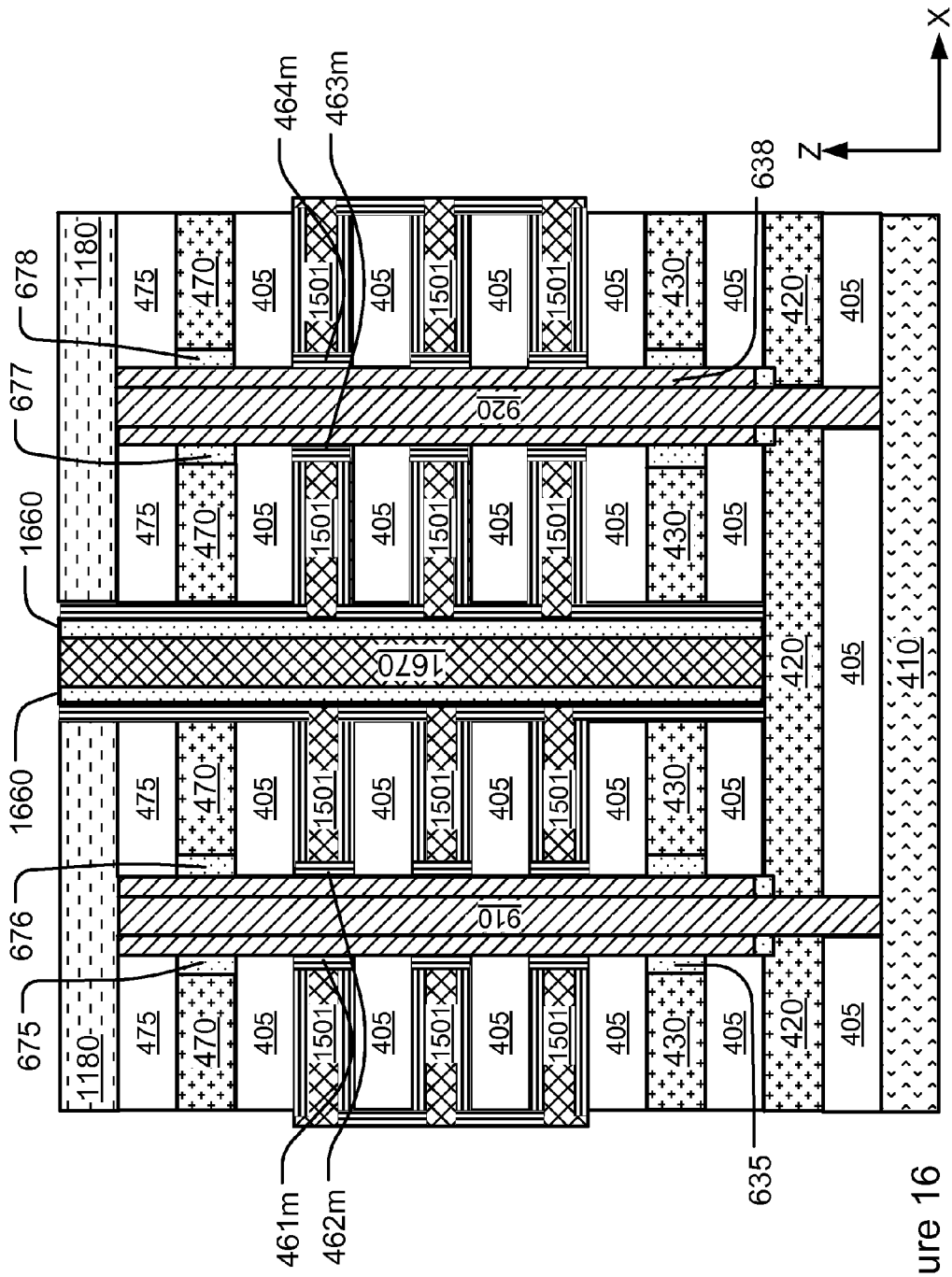

FIG. 16 illustrates a stage in the process after forming spacers (e.g. 1660) on side surfaces in the second openings, and filling the second openings with conductive material to form vertical conductive elements (e.g. 1670) connected to the reference conductor (e.g. 420). The vertical conductive elements (e.g. 1670) can include TiN (titanium nitride), W (tungsten), TaN (tantalum nitride) or Cu (copper), and the spacers can include an oxide material to insulate the vertical conductive elements from the plurality of stacks of conductive strips (e.g. 1541-1544, 1551-1554, 1561-1564).

Figure 17:
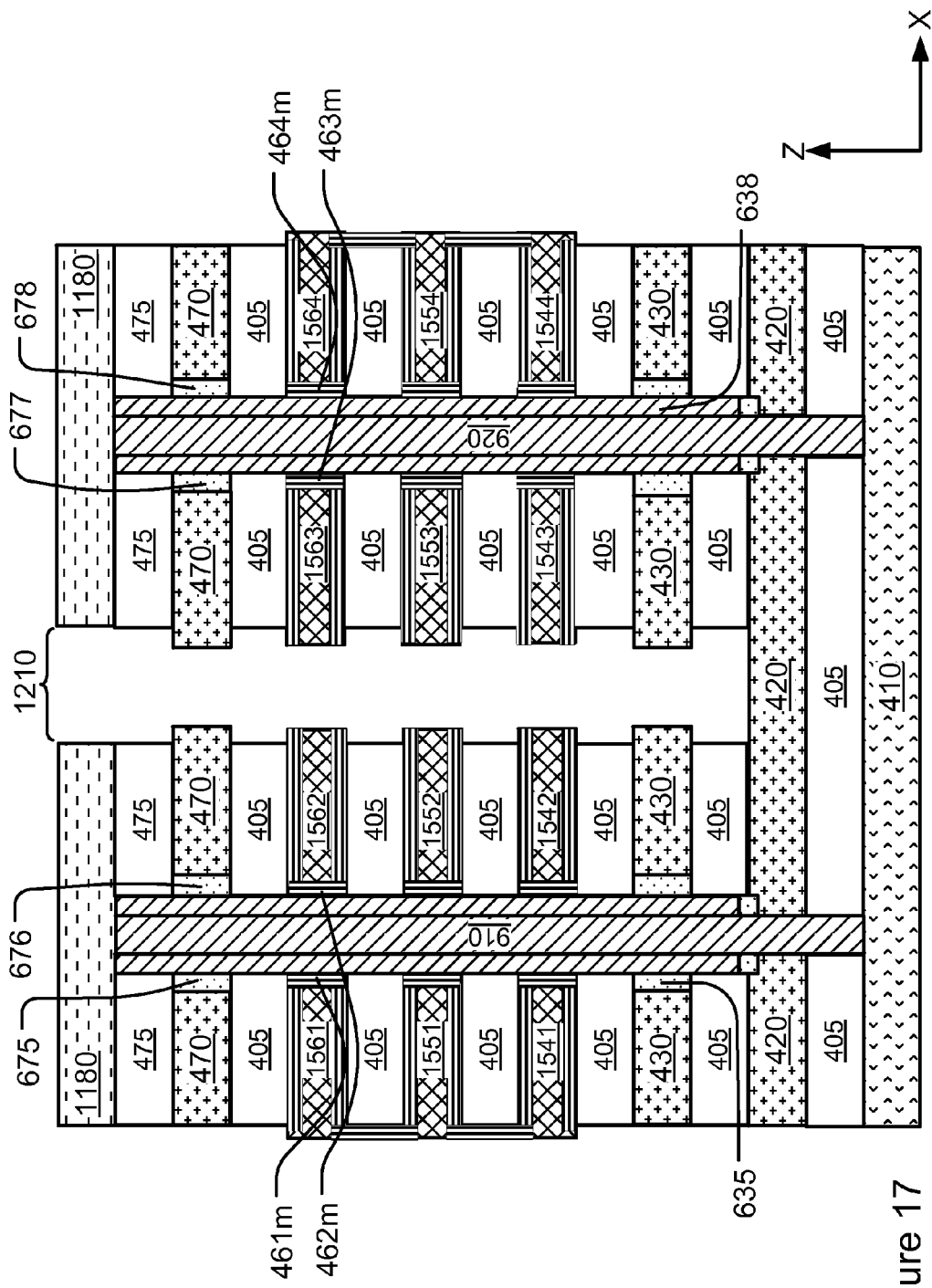
FIGS. 17 through 20 illustrate a variation from the example process flow illustrated by FIGS. 4 through 16.

FIGS. 17 through 20 illustrate a variation from the example process flow illustrated by FIGS. 4-16. The variation includes forming a silicide layer on side surfaces of conductive layers and on a top surface of the reference conductor in the second openings, to reduce resistance of the conductive layers and the reference conductor. FIG. 17 illustrates a stage in the process after applying an isotropical etch to the partially fabricated memory device at the stage illustrated in FIG. 15. As a result of the isotropical etch, the memory layer is removed from inside the second openings (e.g. 1210). Consequently, side surfaces of the top conductive layer (e.g. 470), side surfaces of the bottom conductive layer (e.g. 430), and a top surface of the reference conductor (420) are exposed, inside the second openings (e.g. 1210). As a result of the isotropical etch, layers of insulating material (e.g. 405, 475) may be pulled back slightly inside the second openings (e.g. 1210).

Figure 18:
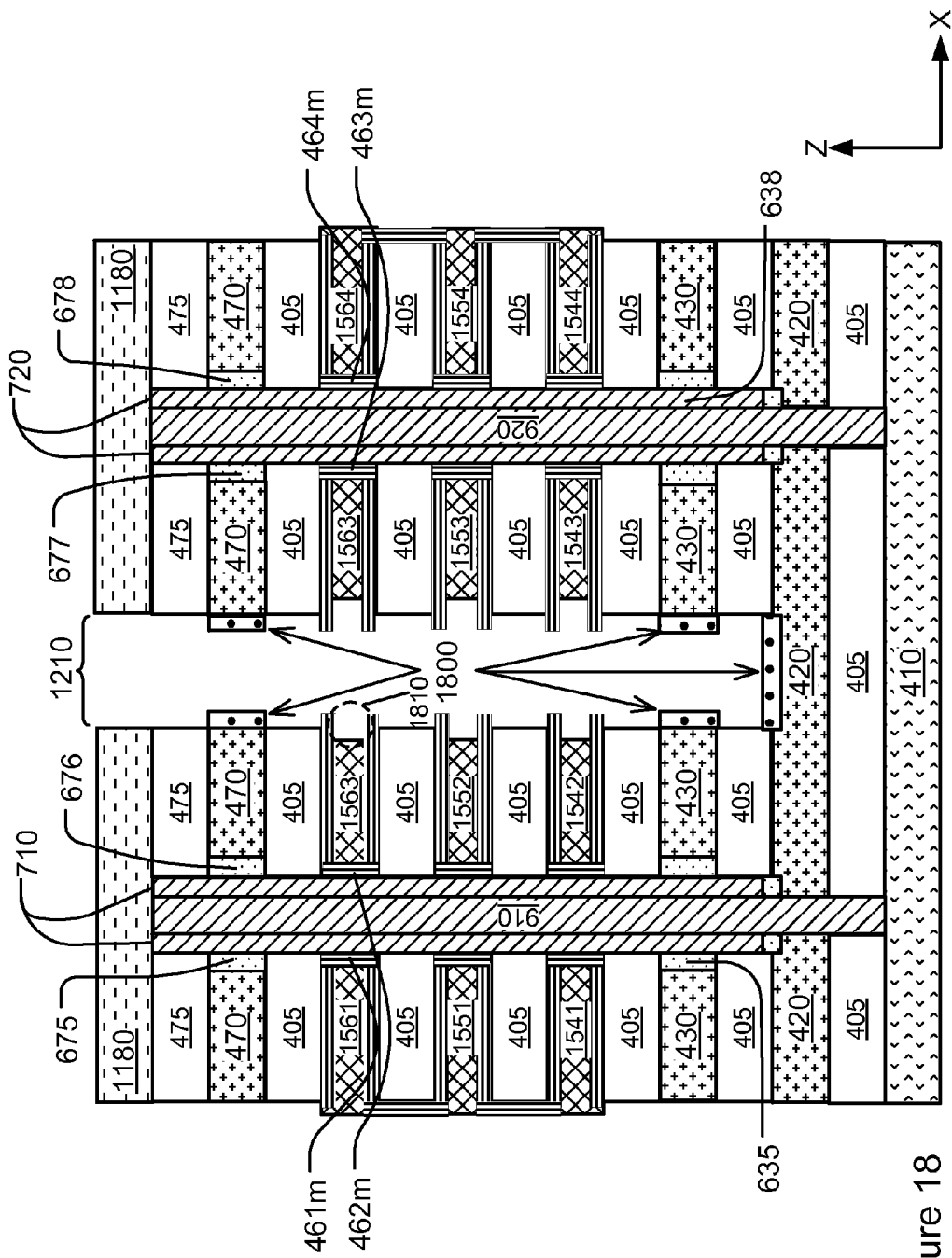

FIG. 18 illustrates a stage in the process after forming a silicide layer (e.g. 1800) on side surfaces of the top conductive layer (e.g. 470), side surfaces of the bottom conductive layer (e.g. 430), and a top surface of the reference conductor (420) inside the second openings (e.g. 1210). The silicide layer can include Ti (titanium), Co (cobalt) and Ni (nickel). As a result of forming the silicide layer, conductive strips in the stacks (e.g. 1541-1544, 1551-1554, 1561-1564) may be pulled back and leave concave regions (e.g. 1810).

Figure 19:
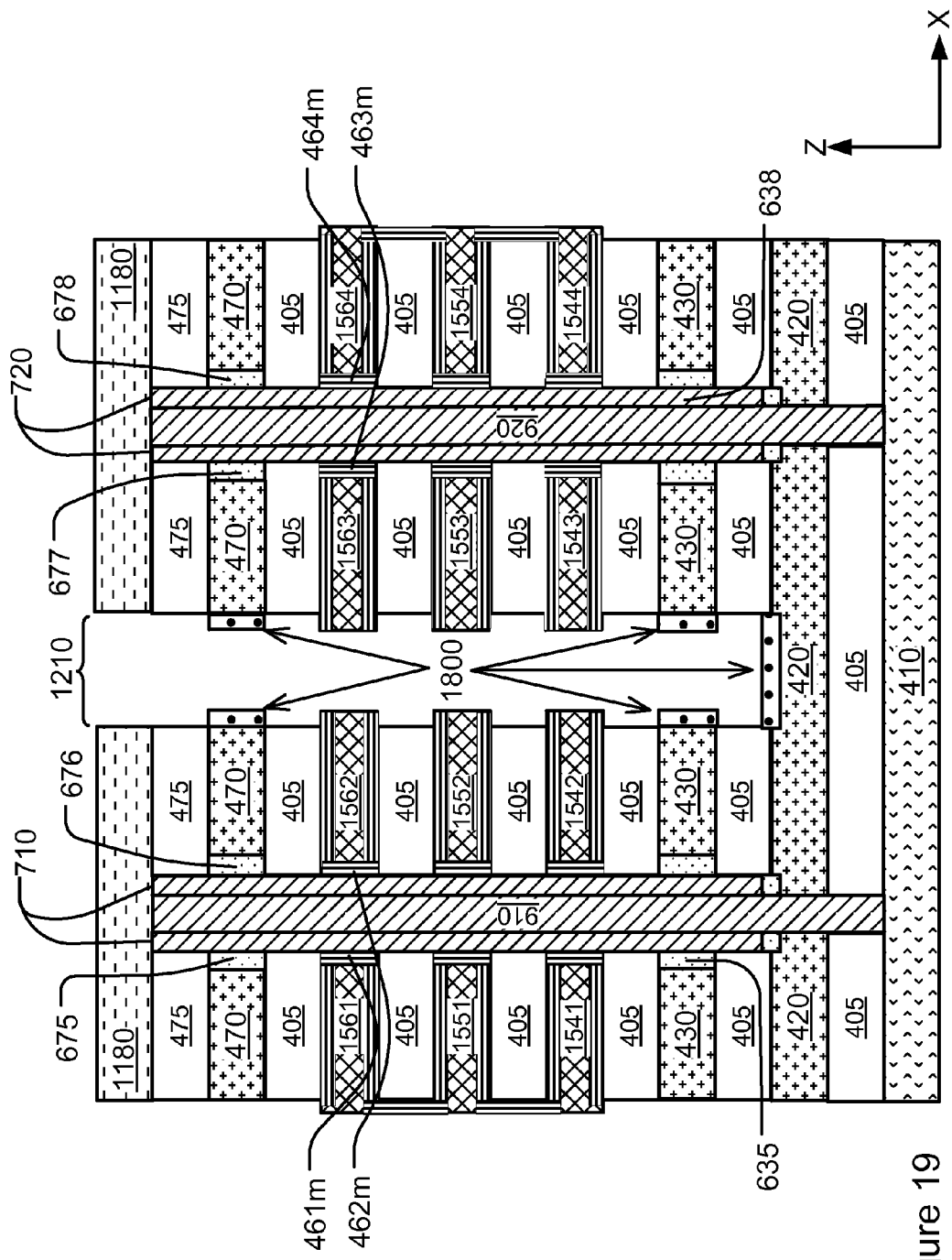

FIG. 19 illustrates a stage in the process after the concave regions (e.g. 1810) are sealed with another deposition of a conductive material through the second openings (e.g. 1210). For instance, the conductive material for sealing the concave regions can be the same conductive material that forms the plurality of stacks of conductive strips in the horizontal openings (e.g. 1541-1544, 1551-1554, 1561-1564).

Figure 20:
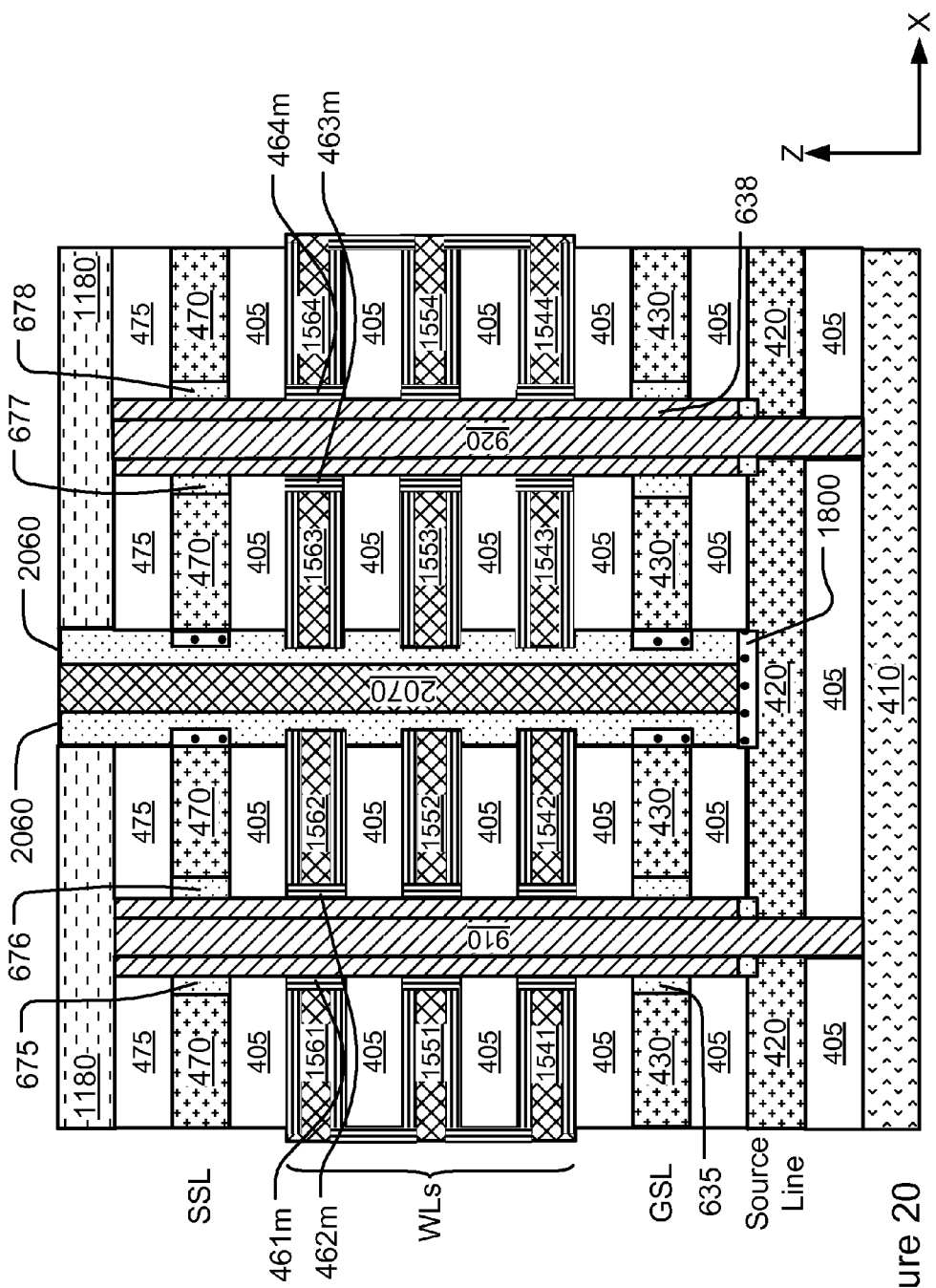

FIG. 20 illustrates a stage in the process after forming spacers (e.g. 2060) on side surfaces in the second openings (e.g. 1210), and filling the second openings with conductive material to form vertical conductive elements (e.g. 2070) connected to the reference conductor (e.g. 420), where a silicide layer 1800 is formed on a top surface of the reference conductor (e.g. 420). The vertical conductive elements (e.g. 2070) can include TiN (titanium nitride) or W (tungsten), and the spacers can include an oxide material to insulate the vertical conductive elements (e.g. 2070) from the plurality of stacks of conductive strips (e.g. 1541-1544, 1551-1554, 1561-1564).

The memory device can include a bias circuit (e.g. 268, FIG. 2) connected to a substrate (e.g. 410, FIG. 1), a reference conductor (e.g. 420), a bottom level of conductive strips (e.g. 430, GSL), a plurality of intermediate levels of conductive strips (e.g. 1541-1544, 1551-1554, 1561-1564, WL), and a top level of conductive strips (e.g. 470, SSL), and the vertical active strips in the plurality of vertical active strips (e.g. 910, 920, BL). The bias circuit can be configured to provide different bias arrangements to the reference conductor and the substrate. The program bias arrangement can be understood with reference to the illustrated example as follows, where Vpgm is the program voltage applied to a word line connected to a selected memory cell in a string of memory cells, and Vpass is the pass voltage applied to word lines connected to unselected memory cells in the string.

Selected BL: 0V
Unselected BL: 3.3V
Selected SSL: 3.3V
Unselected SSL: 0V
Selected WL: Vpgm
Unselected WL: Vpass
GSL: 0V
N+ source contact on the reference conductor: 0V
P substrate source side: 0V (PN diode turned off)
Deep N well surrounded by P substrate: 20V or 0V The read bias arrangement can be understood with reference to the illustrated example as follows:

Selected BL: 1V
Unselected BL: 0V
Selected SSL: 3.3V
Unselected SSL: 0V
Selected WL: Vref
Unselected WL: Vpass
GSL: 3.3V
N+source contact on the reference conductor: 0V
P substrate source side: 0V
Deep N well surrounded by P substrate: 20V or 0V The block erase bias arrangement can be understood with reference to the illustrated example as follows:

All BL: Floating
All SSL: floating or 6~8V to prevent from being erased
All WL: 0V
All GSL: floating or 6~8V to prevent from being erased
N+ source contact on the reference conductor: floating
P substrate source side: 20V
Deep N well surrounded by P substrate: 20V A controller, implemented as a state machine (e.g. 269, FIG. 2), provides signals to control the application of biasing arrangement supply voltages generated or provided through the voltage supply or supplies in the bias circuit (e.g. 268, FIG. 2) to carry out the various operations described herein, including operations to program, read and erase data in the memory array (e.g. 260, FIG. 2).

Figure 21:
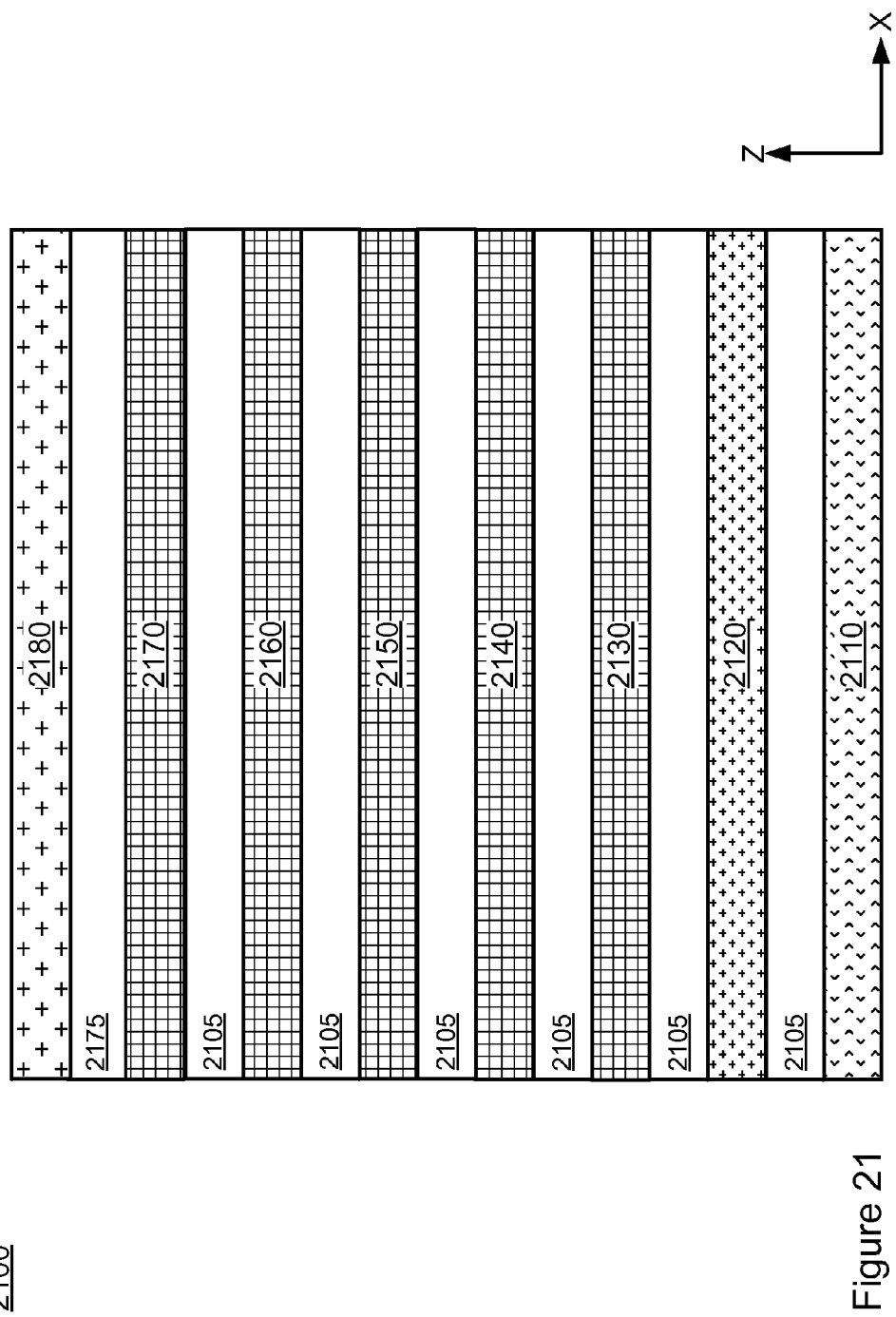
FIGS. 21 through 33 illustrate an alternative example process flow for manufacturing a memory device.

FIGS. 21 through 33 illustrate an alternative example process flow for manufacturing a memory device. FIG. 21 illustrates a cross-section in the X-Z plane of a partially fabricated memory device. In the example shown in FIG. 21, a memory device 2100 includes a reference conductor (e.g. 2120) on a substrate (e.g. 2110), isolated from the substrate by a layer of insulating material (e.g. 2105). The memory device includes a plurality of sacrificial layers (e.g. 2130, 2140, 2150, 2160, and 2170) for forming word lines (WLs), string select lines (SSL), and forming ground select lines (GSL). The sacrificial layers are separated by insulating layers (e.g. 2105). A hard mask (e.g. 2180) is disposed on the sacrificial layers for patterning the sacrificial layers, and separated from the plurality of sacrificial layers (e.g. 2130-2170) by a layer of insulating material (e.g. 2175).

The hard mask (e.g. 2180) and the plurality of sacrificial layers (e.g. 2130-2170) can include silicon nitride. The reference conductor (e.g. 2120) can include N type semiconductor material. The substrate (e.g. 2110) can include P type semiconductor material.

Figure 22:
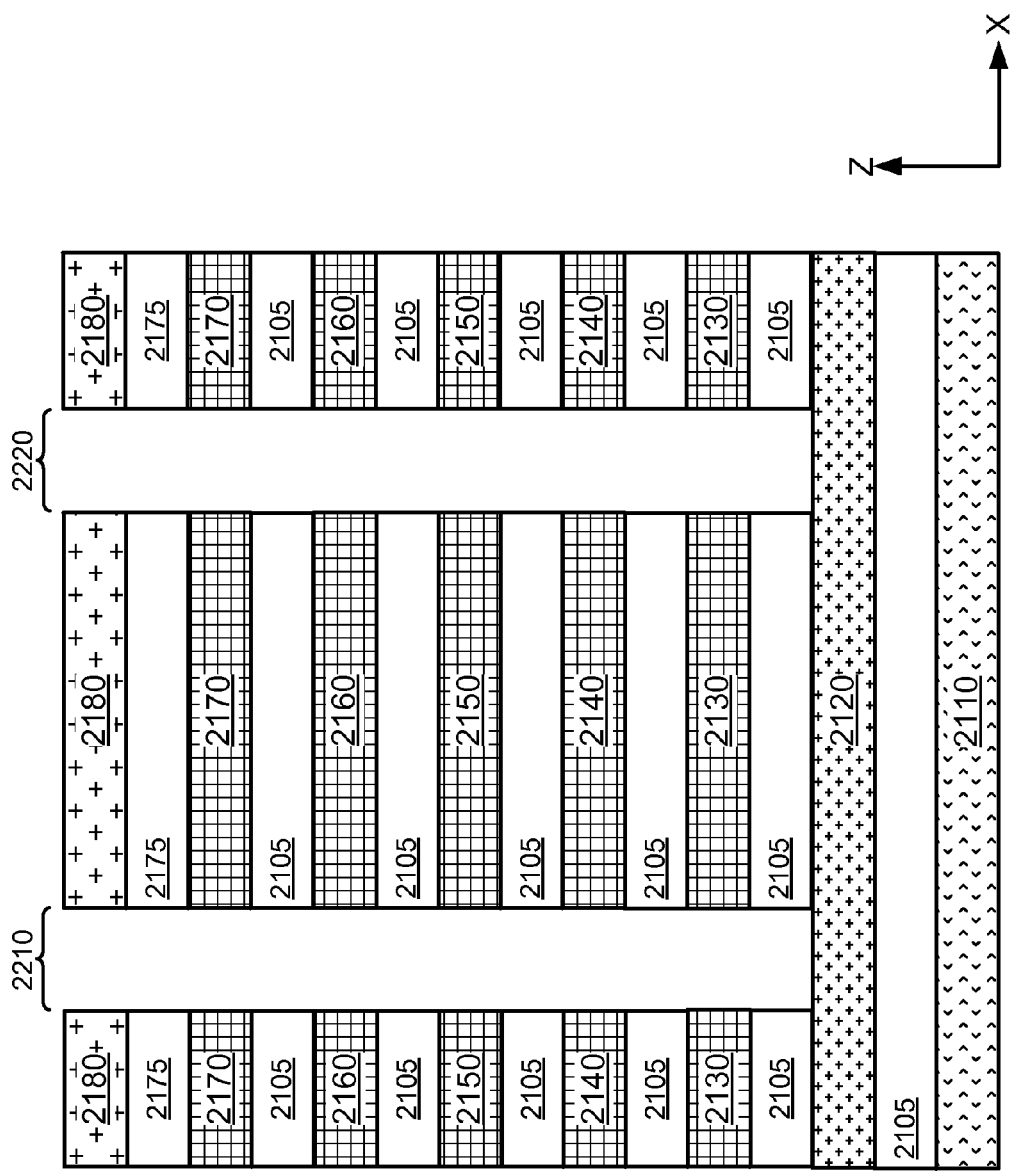

FIG. 22 illustrates a stage in the example process after etching the sacrificial layers to form first openings (e.g. 2210, 2220), stopping on the reference conductor (e.g. 2120). For instance, the sacrificial layers can be etched with RIE (reactive ion etching). The first openings are etched through the plurality of sacrificial layers (e.g. 2130-2170). The first openings can be used to form a plurality of vertical active strips.

Figure 23:
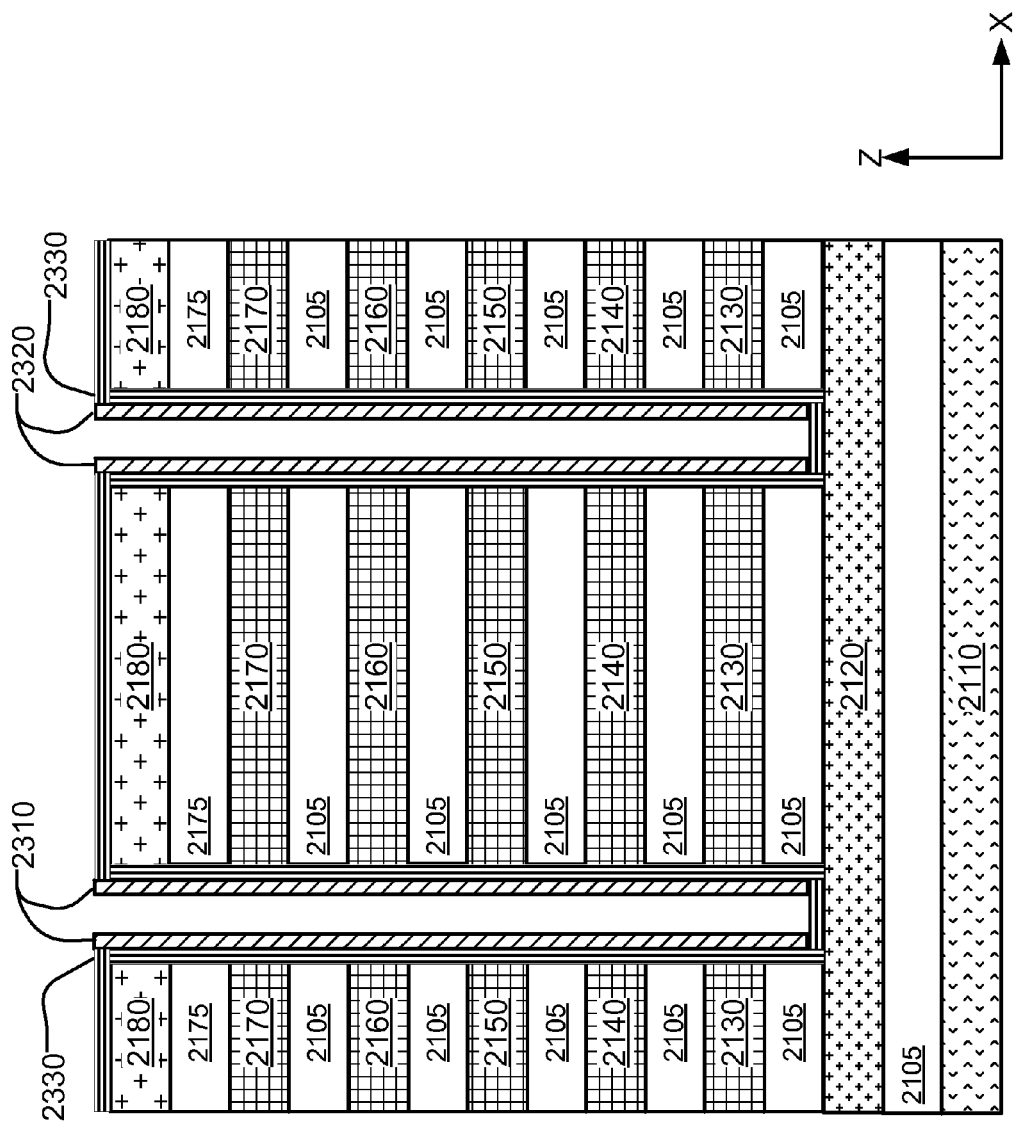

FIG. 23 illustrates a stage in the process after forming a memory layer (e.g. 2330) on side surfaces of the sacrificial layers in the first openings, and forming spacers (e.g. 2310, 2320) on the memory layer in the first openings. Side surfaces of sacrificial layers (e.g. 2130-2170) contact the memory layer. The memory layer can include materials as described in connection with FIG. 14. The sacrificial layers and the hard mask can include silicon nitride. The spacers can include P type or intrinsic semiconductor material, and can become part of the channel regions for memory cells formed in the memory device.

Figure 24:
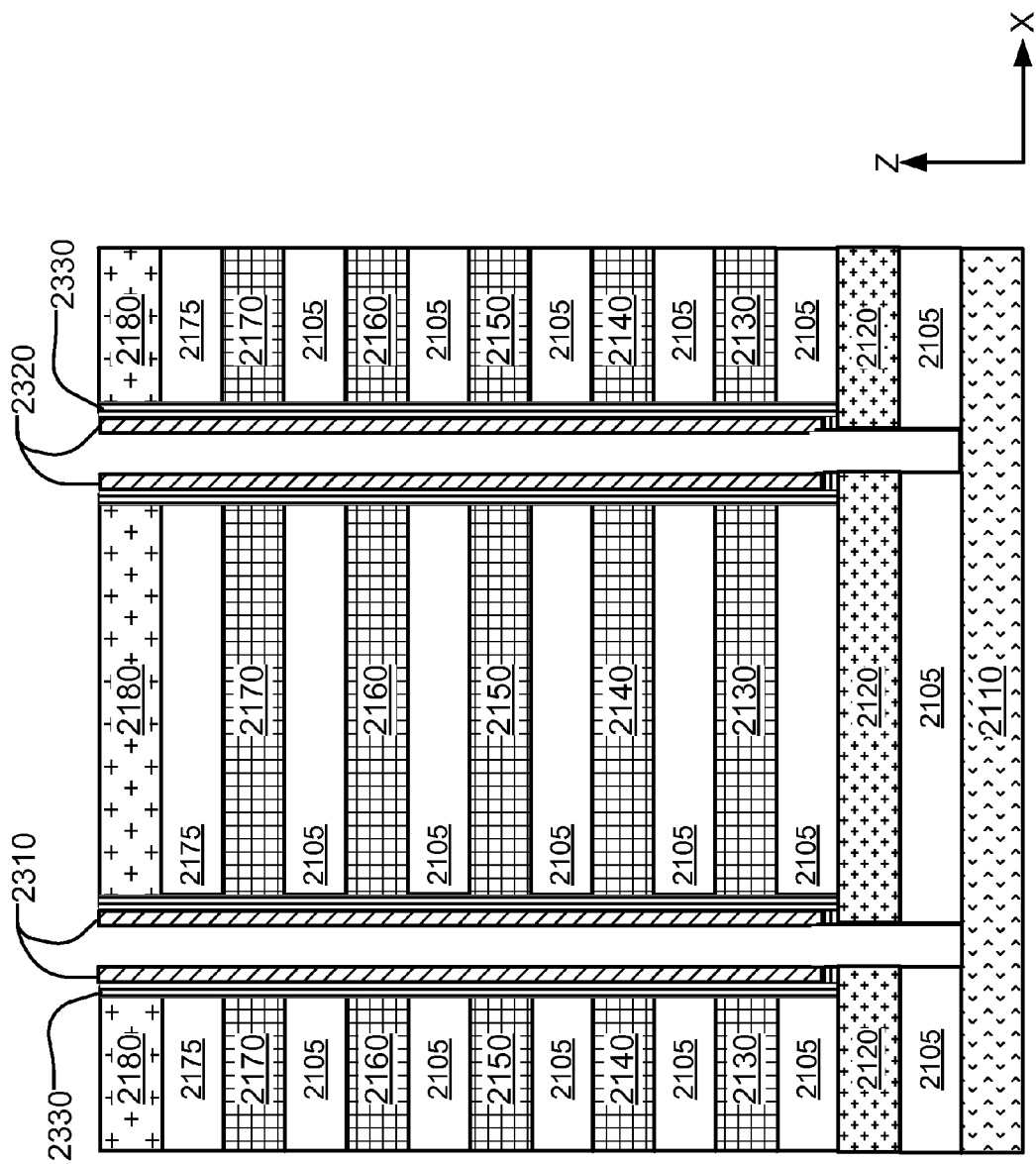

FIG. 24 illustrates a stage in the process after etching the reference conductor in the first openings (e.g. 2120), and a layer of insulating material (e.g. 2105) between the reference conductor and the substrate in the first openings, stopping on the substrate (e.g. 2110).

Figure 25:
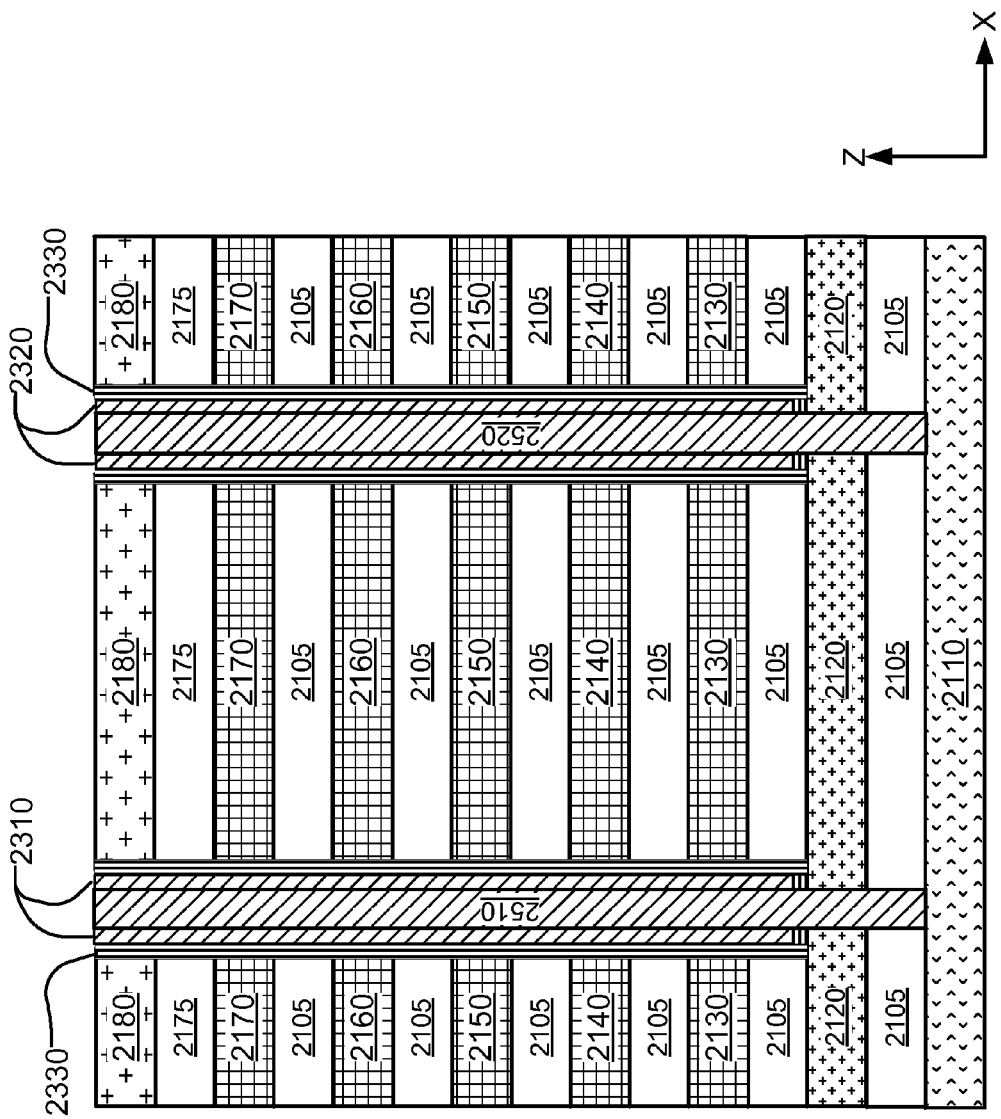
Figure 25A:
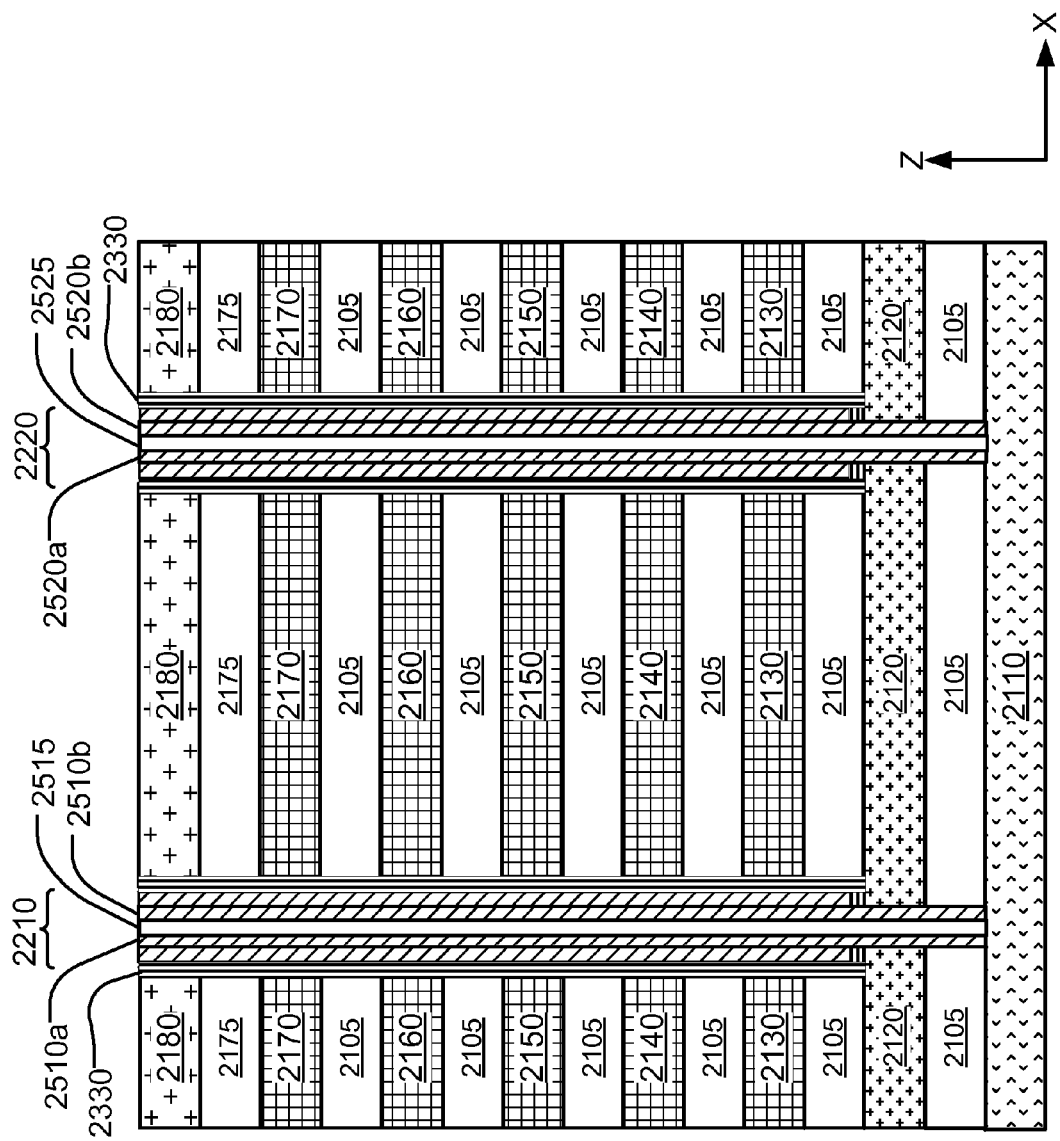

FIG. 25 illustrates a stage in the process after forming a plurality of vertical active strips (e.g. 2510, 2520) in the first openings. The vertical active strips are in electrical contact with the substrate (e.g. 2110) and with the reference conductor (e.g. 2120). In an alternative embodiment, as shown in the example of FIG. 25A, a vertical channel structure can be implemented in a "macaroni" style, where an air gap or a seam (e.g. 2515, 2525) can be formed between a left vertical active strip (e.g. 2510a, 2520a) and a right vertical active strip (e.g. 2510b, 2520b) inside a first opening (e.g. 2210, 2220). The air gap or seam can suppress channel to channel coupling that can cause Z-direction disturb in 3D vertical channel structures.

Figure 26:
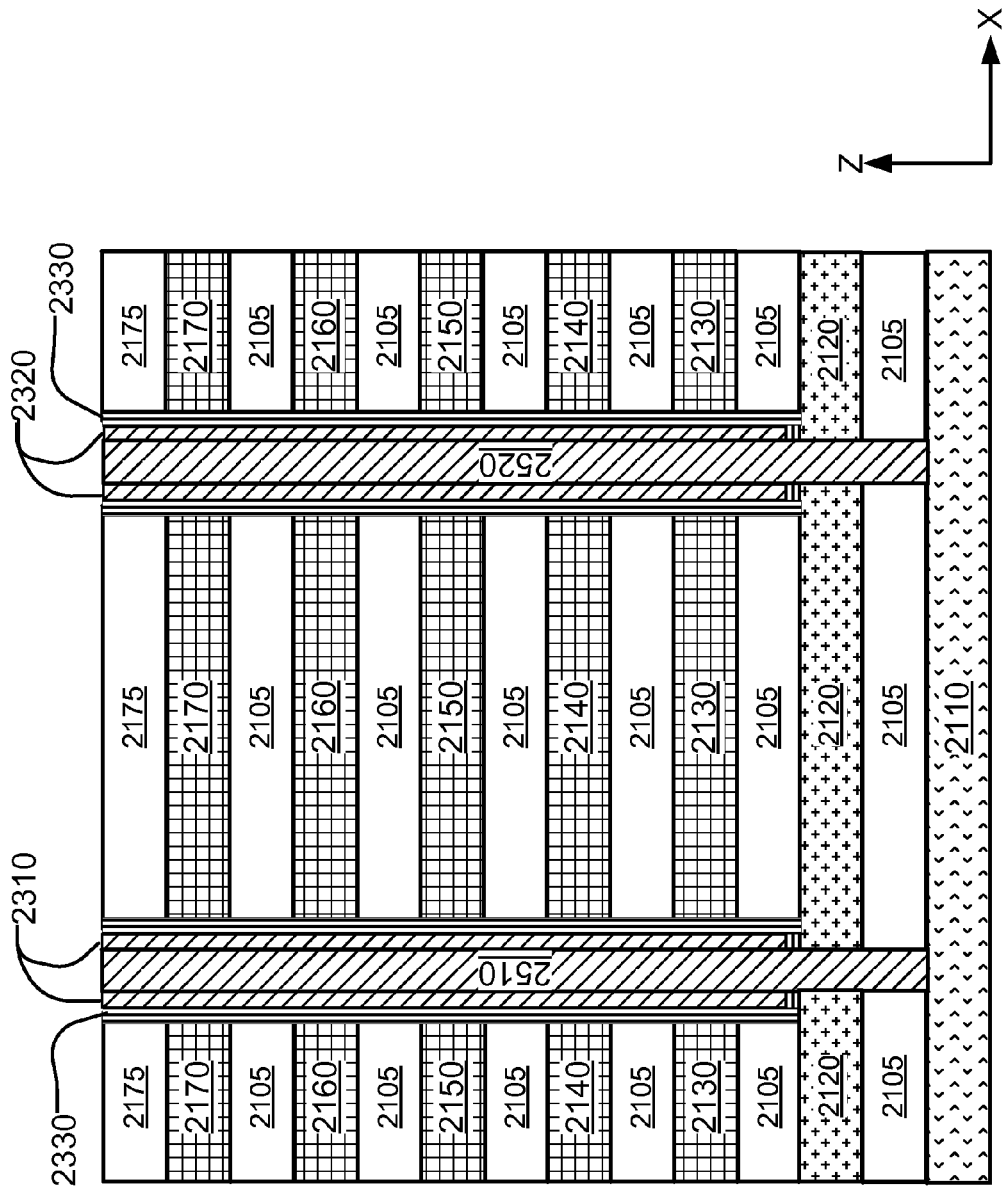

FIG. 26 illustrates a stage in the process after removing the hard mask (e.g. 2180), for instance using CMP (chemical-mechanical-planarization), stopping at an insulation layer (e.g. 2175) below the hard mask.

Figure 27:
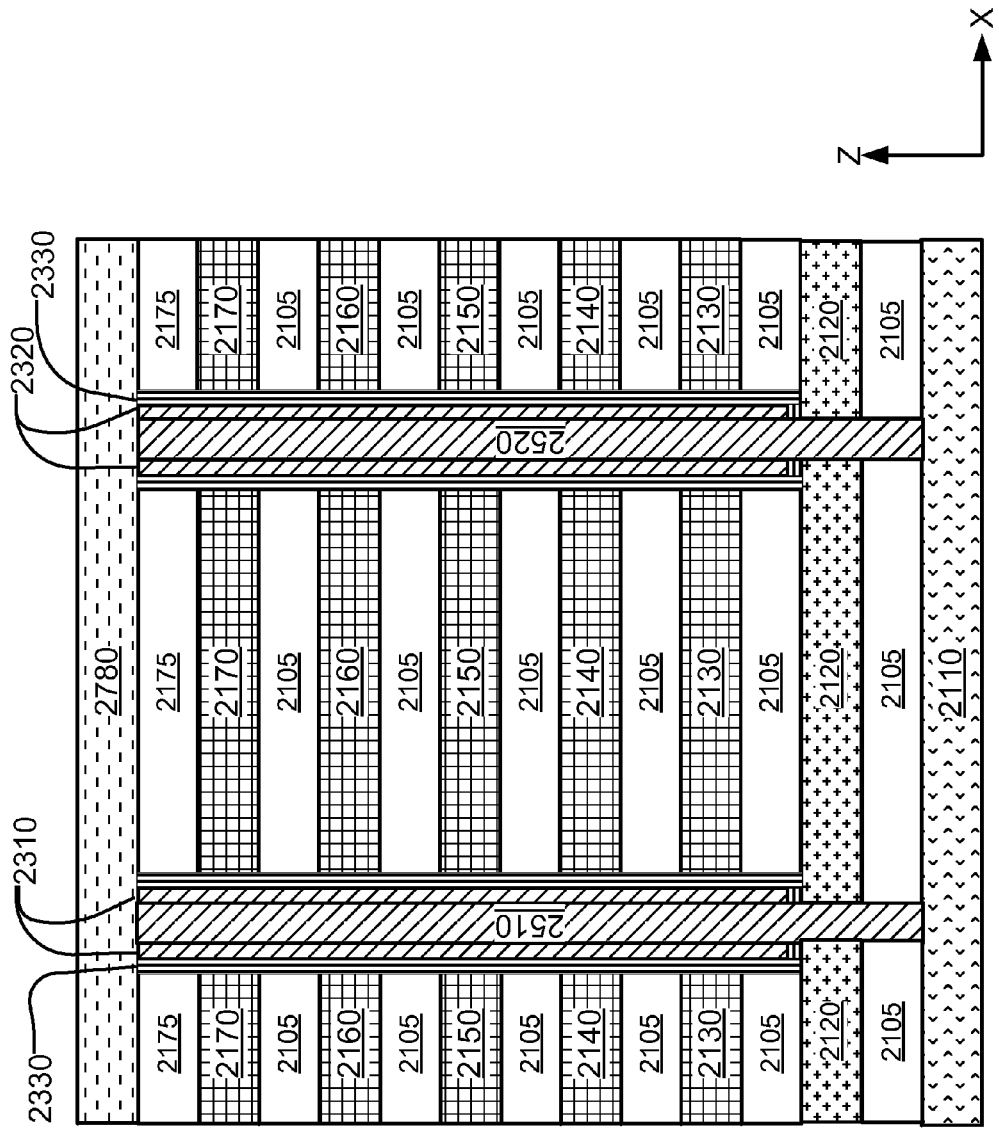

FIG. 27 illustrates a stage in the process after depositing a layer of insulating material (e.g. 2780), such as an oxide material, to protect the plurality of vertical active strips (e.g. 2510, 2520) and the spacers in the first openings (e.g. 2310, 2320) from subsequent patterning steps, where the vertical active strips and spacers can form parts of the channel regions for memory cells in the memory device.

Figure 28:
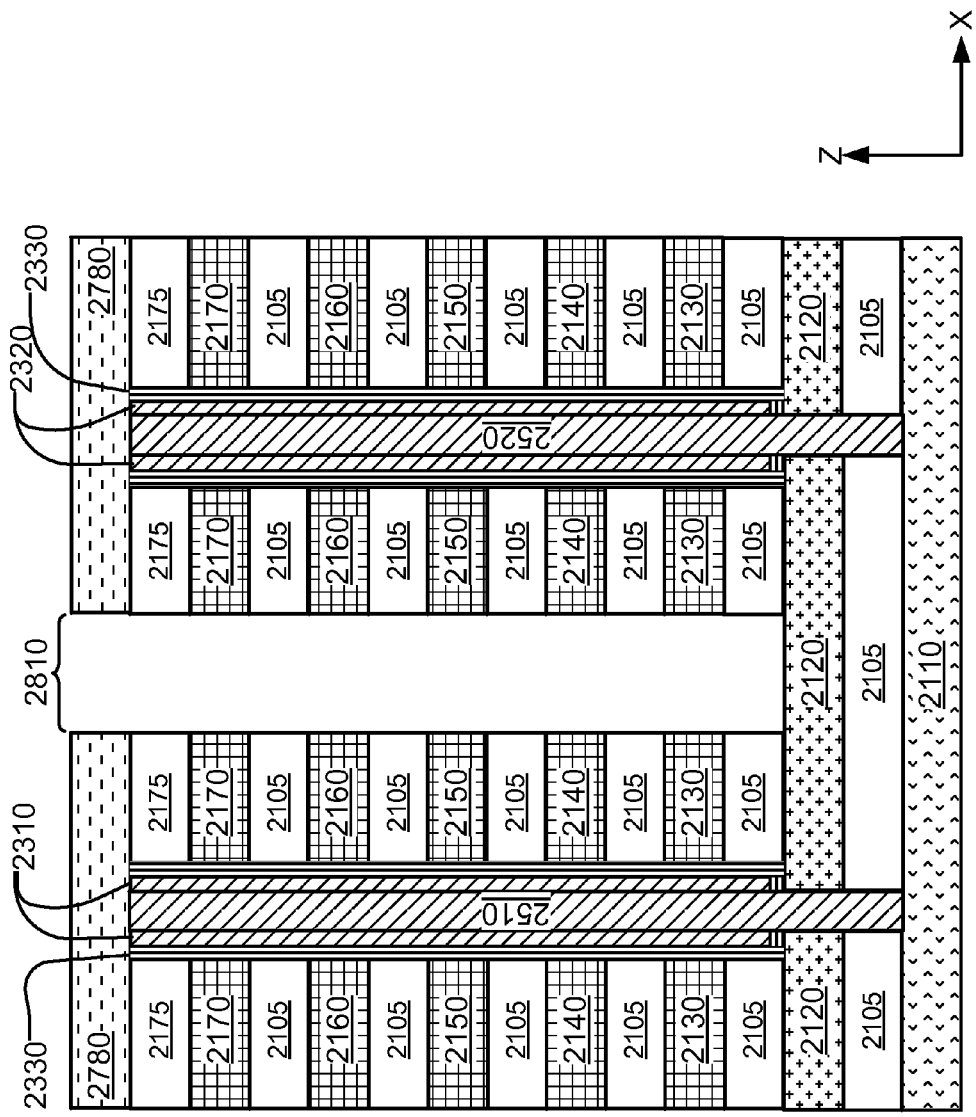

FIG. 28 illustrates a stage in the process after etching the sacrificial layers to form second openings (e.g. 2810) between adjacent vertical active strips (e.g. 2510, 2520) in the plurality of vertical active strips, stopping on the reference conductor (e.g. 2120). The plurality of sacrificial layers (e.g. 2130-2170) is exposed by the second openings.

Figure 29:
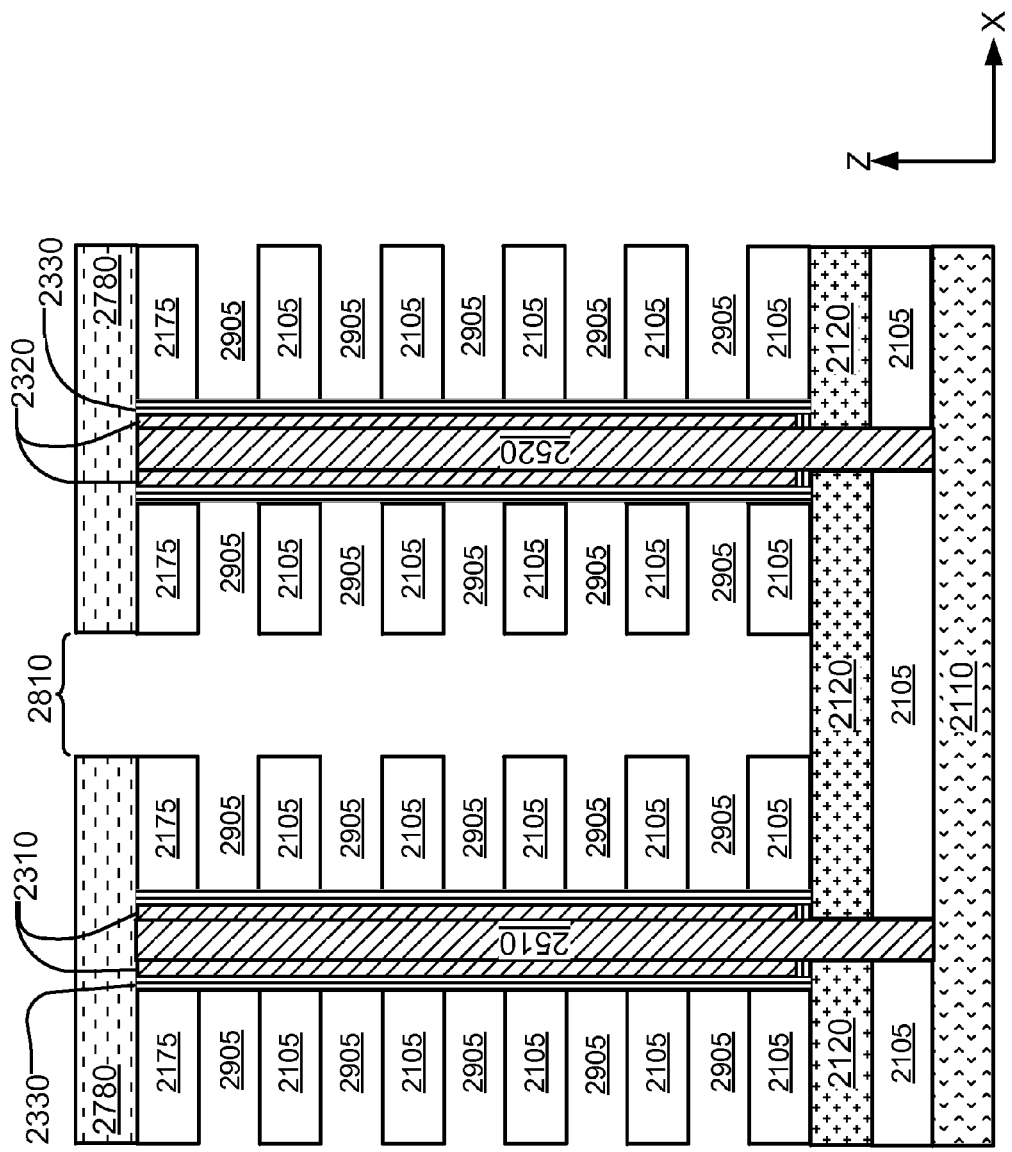

FIG. 29 illustrates a stage in the process after removing the plurality of sacrificial layers exposed by the second openings to form horizontal openings (e.g. 2905) between the insulating layers (e.g. 2105). This stage in the process leaves the insulating layers (e.g. 2105) adhered to the memory layer (e.g. 2330), with horizontal openings (e.g. 2905) in between. Horizontal openings 2905 can be used for forming string select lines (SSLs), word lines (WLs), and ground select lines (GSLs). The plurality of sacrificial layers can be removed by an etching process using phosphoric acid (H3PO4) as an etchant. Phosphoric acid (H3PO4) is highly selective to the silicon nitride material used in the sacrificial layers, and to the oxide material used in the insulation layers.

Figure 30:
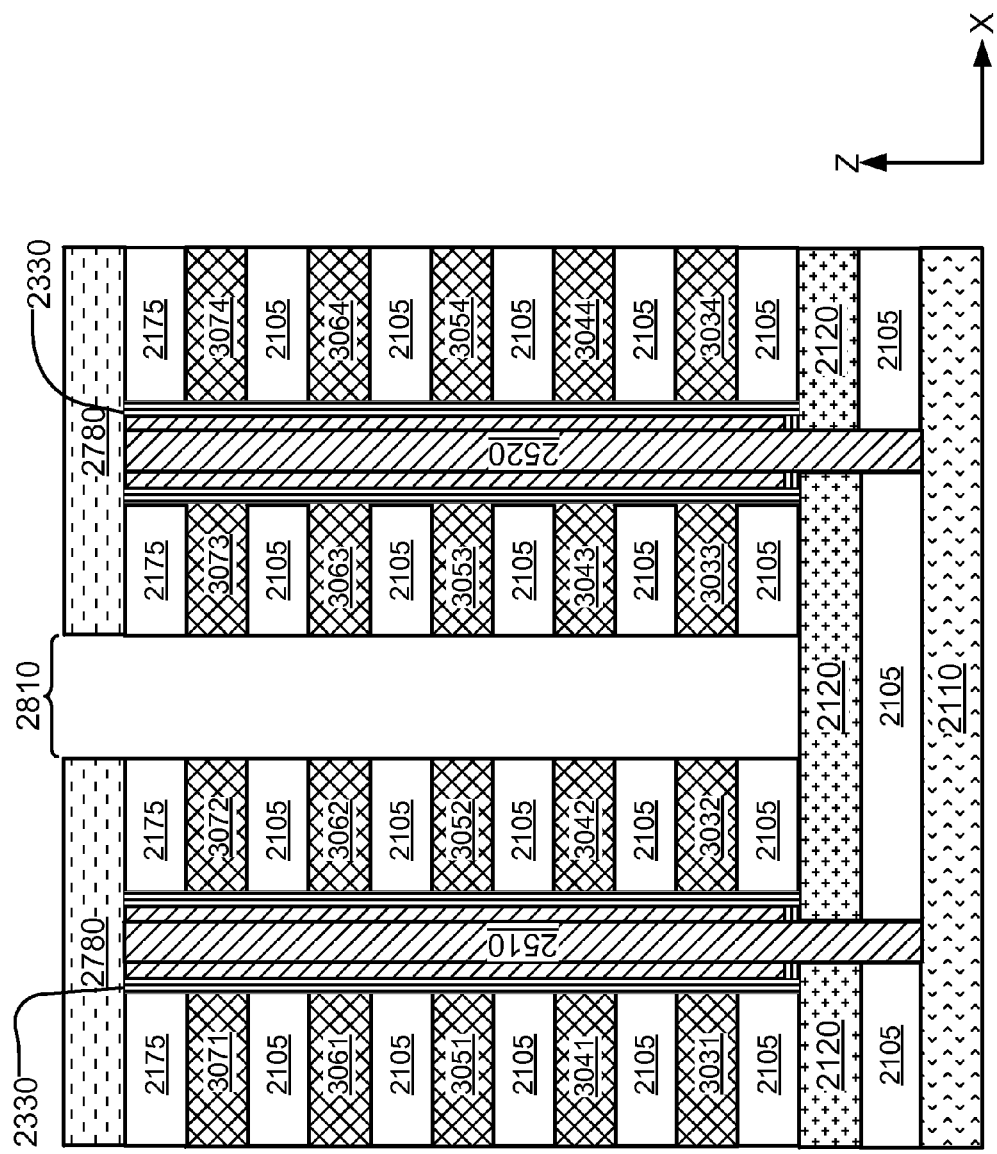

FIG. 30 illustrates a stage in the process after depositing a conductive material over the memory layer (e.g. 2330), through the second openings (e.g. 2810), to form a plurality of stacks of conductive strips in the horizontal openings (e.g. 3031-3034, 3041-3044, 3051-3054, 3061-3064, 3071-3074). For instance, a top level of conductive strips in the plurality of stacks (e.g. 3071-3074) can act as string select lines (SSLs), a plurality of intermediate levels of conductive strips (e.g. 3041-3044, 3051-3054, 3061-3064) can act as word lines (WLs), and a bottom level of conductive strips in the plurality of stacks (e.g. 3031-3034) can act as ground select lines (GSLs). The conductive material can include Ti (titanium), TiN (titanium nitride), Ta (tantalum), TaN (tantalum nitride), W (tungsten) and Cu (copper). Side surfaces of conductive strips in the plurality of stacks contact the memory layer. Conductive strips in the plurality of stacks are in a Y direction perpendicular to the X-Z plane.

Figure 31:
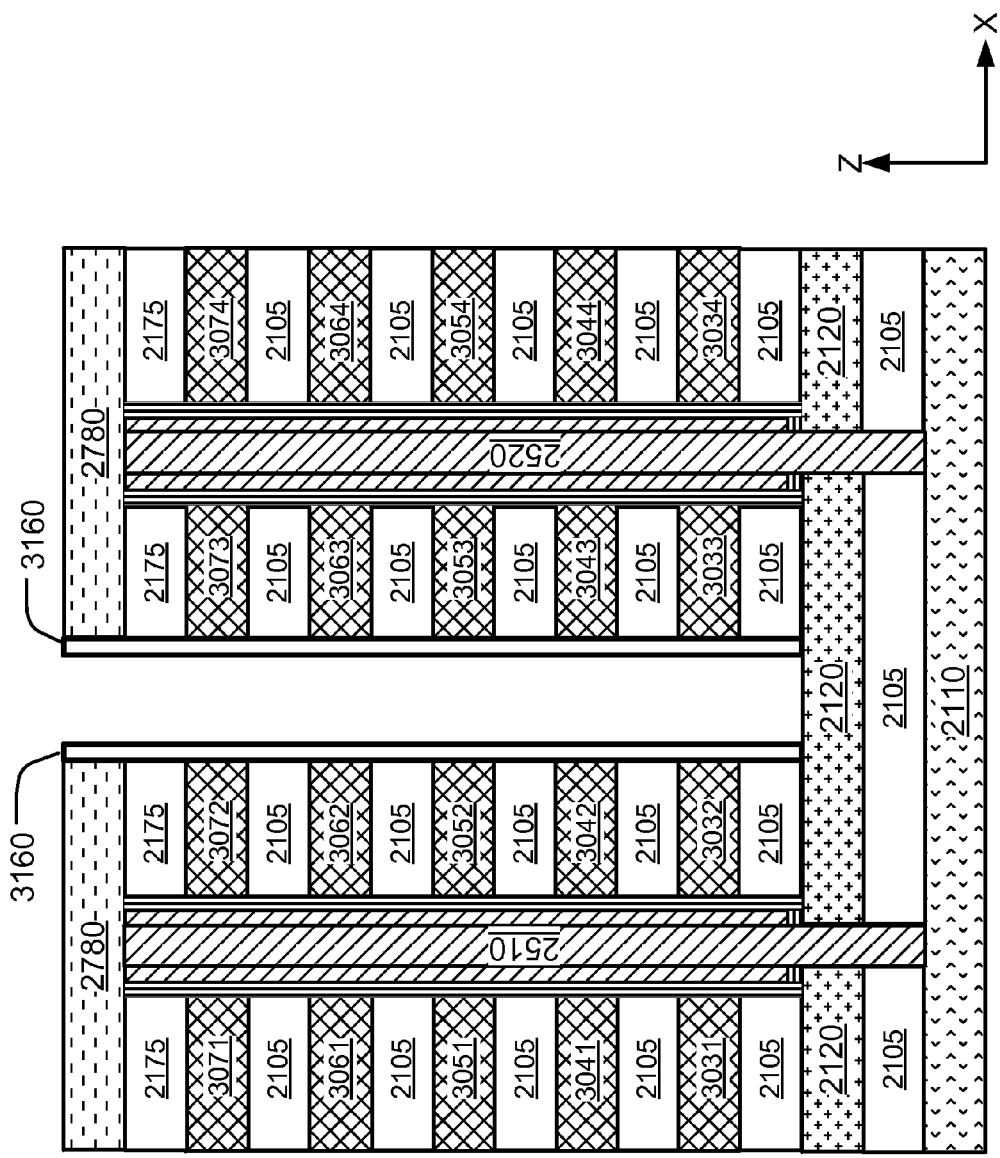
Figure 32:
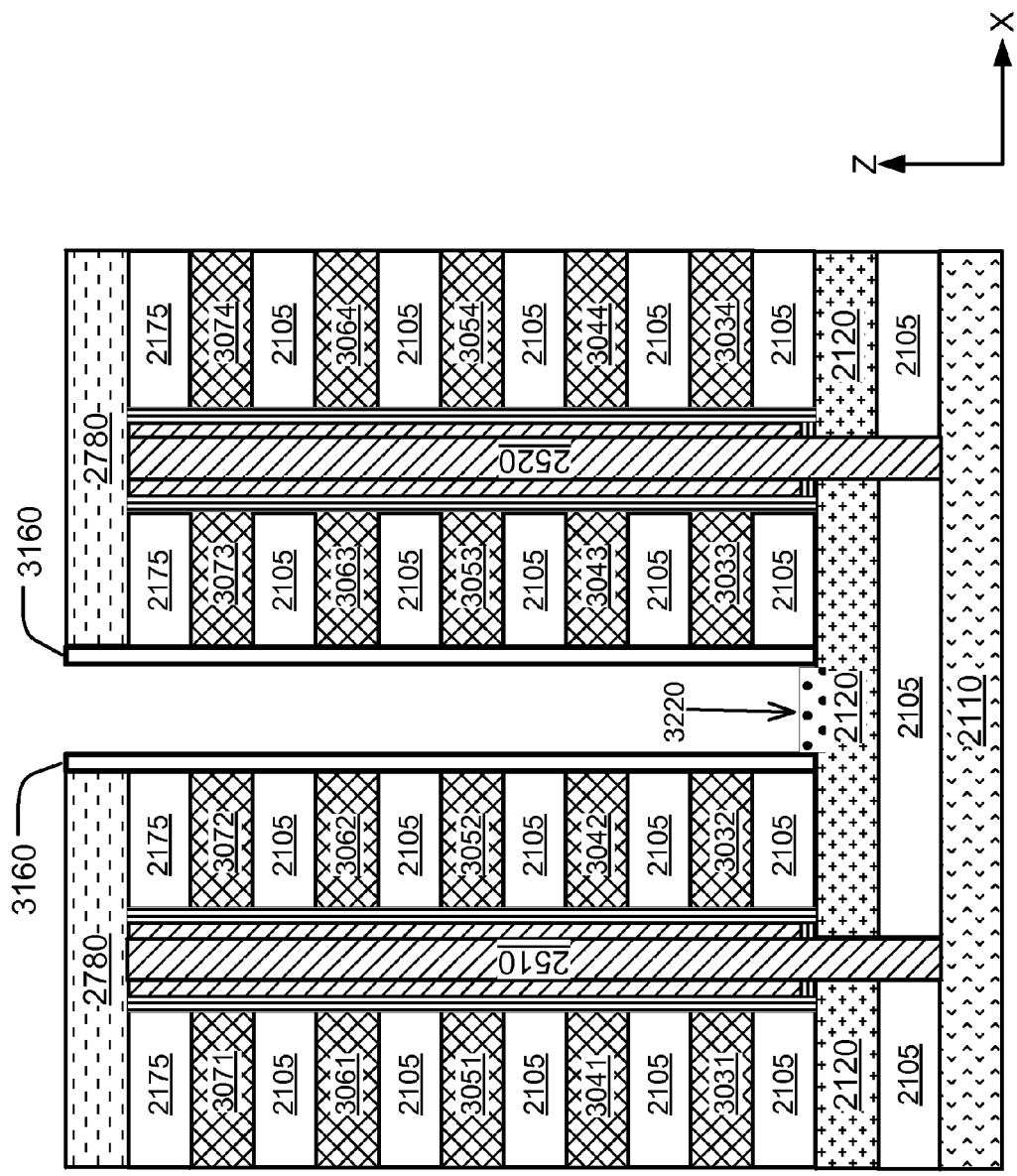

FIG. 31 illustrates a stage in the process after forming spacers (e.g. 3160) on side surfaces in the second openings. FIG. 32 illustrates a stage in the process after forming a silicide layer (e.g. 3220) on a top surface of the reference conductor in the second openings between the spacers (e.g. 3160). The silicide layer (e.g. 3220) can reduce resistance of the reference conductor (2120).

Figure 33:
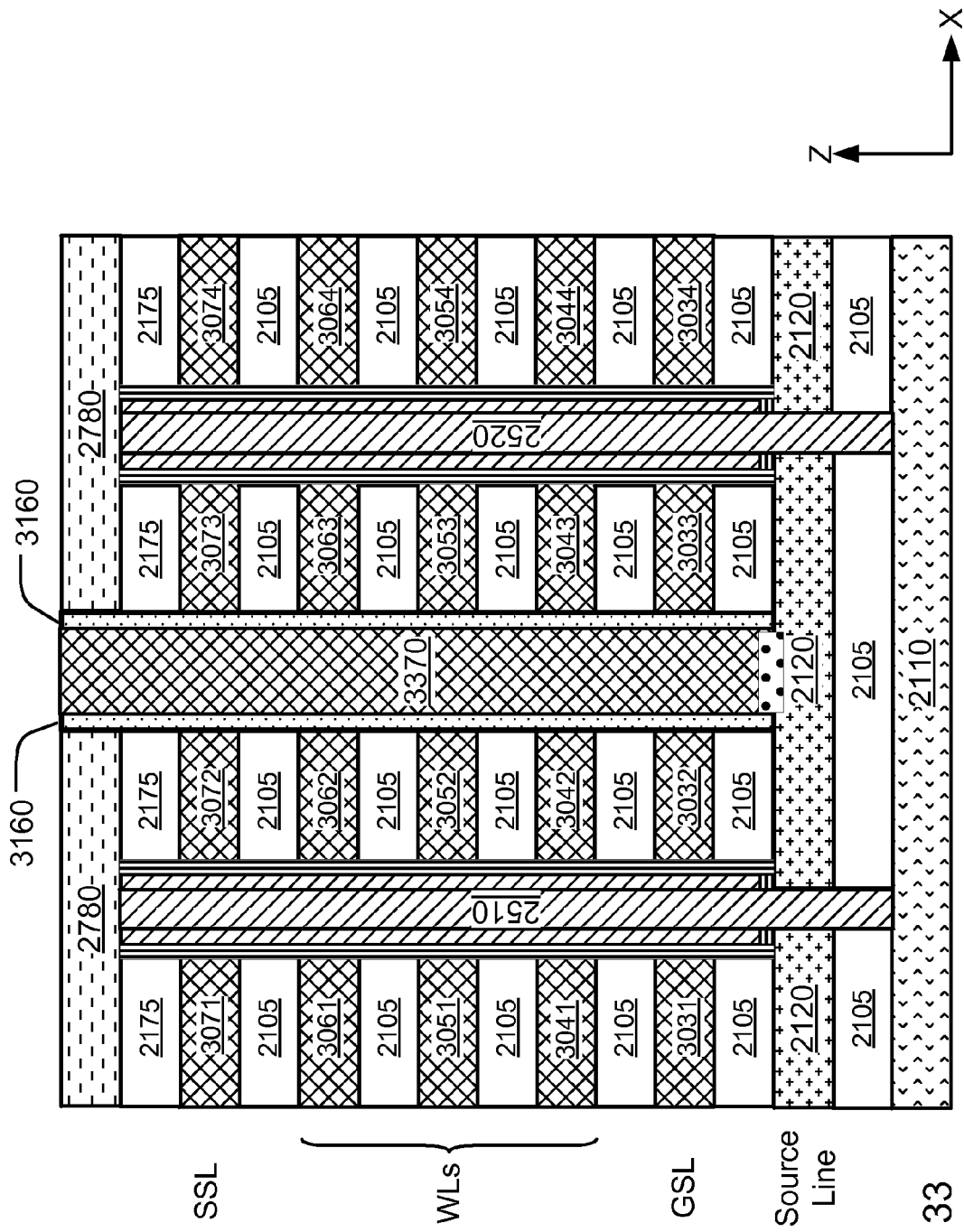

FIG. 33 illustrates a stage in the process after filling the second openings with conductive material to form vertical conductive elements (e.g. 3370) connected to the reference conductor (e.g. 2120). The vertical conductive elements (e.g. 3370) can include TiN (titanium nitride), W (tungsten), TaN (tantalum nitride) or Cu (copper), and the spacers (e.g. 3160) can include an oxide material to insulate the vertical conductive elements from the plurality of stacks of conductive strips (e.g. 3031-3034, 3041-3044, 3051-3054, 3061-3064, 3071-3074).

The manufacturing process continues to complete a 3D memory array.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory device including an array of strings of memory cells, comprising:
   a substrate;
   a plurality of stacks of conductive strips separated by insulating material;
   a reference conductor disposed in a level between the plurality of stacks of conductive strips and the substrate, isolated from the substrate by a layer of insulating material, and isolated from the plurality of stacks by another layer of insulating material; and a plurality of vertical active strips between the plurality of stacks in electrical contact with the substrate, and with the reference conductor.

2. The memory device of claim 1, comprising:
PN junctions at interface regions between the vertical active strips and the substrate wherein the vertical active strips are in electrical contact with the substrate.

3. The memory device of claim 1, wherein the substrate is an isolated well, comprising a bias circuit connected to the reference conductor, the isolated well, the conductive strips in the stacks of conductive strips, and the vertical active strips in the plurality of vertical active strips, the bias circuit configured to provide different bias arrangements to the reference conductor and the substrate.

4. The memory device of claim 1, wherein the substrate includes P type semiconductor material and the reference conductor includes N type semiconductor material.

5. The memory device of claim 1, comprising:
a vertical conductive element connected to the reference conductor, the vertical conductive element arranged orthogonally to and insulated from the plurality of stacks of conductive strips.

6. The memory device of claim 1, wherein the substrate includes P type semiconductor material and the reference conductor includes N type semiconductor material.

7. The memory device of claim 1, comprising:
a silicide layer on side surfaces of the conductive strips in at least one of a top level of conductive strips and a bottom level of conductive strips in the plurality of stacks.

8. The memory device of claim 1, comprising:
a silicide layer on a top surface of the reference conductor.

9. The memory device of claim 1, comprising:
charge storage structures in interface regions at crosspoints between side surfaces of the conductive strips in the plurality of stacks and the vertical active strips in the plurality of vertical active strips.

10. A method for manufacturing a memory device, comprising:
forming a reference conductor on a substrate, isolated from the substrate by a layer of insulating material;
forming a plurality of sacrificial layers separated by insulating layers on the reference conductor;
etching the sacrificial layers to form first openings, stopping on the reference conductor;
etching the reference conductor in the first openings, stopping on the substrate;
forming a plurality of vertical active strips in the first openings, vertical active strips in the plurality of vertical active strips in electrical contact with the substrate and with the reference conductor;
etching the sacrificial layers to form second openings between adjacent vertical active strips in the plurality of vertical active strips, stopping on the reference conductor, thereby exposing the plurality of sacrificial layers;
removing the plurality of sacrificial layers exposed by the second openings to form horizontal openings between the insulating layers; and
forming a plurality of stacks of conductive strips in the horizontal openings.

11. The method of claim 10, comprising:
forming spacers on side surfaces in the second openings; and
filling the second openings with conductive material to form vertical conductive elements connected to the reference conductor.

12. The method of claim 10, wherein the substrate is an isolated well, comprising:
forming a bias circuit connected to the reference conductor, the isolated well, the conductive strips in the stacks of conductive strips, and the vertical active strips in the plurality of vertical active strips, the bias circuit configured to provide different bias arrangements to the reference conductor and the substrate.

13. The method of claim 10, wherein the substrate includes P type semiconductor material and the reference conductor includes N type semiconductor material.

14. The method of claim 10, comprising:
forming at least one of a top conductive layer above the plurality of sacrificial layers and a bottom conductive layer between the plurality of sacrificial layers and the reference conductor, separated by insulating layers; and
etching the at least one of a top conductive layer and the bottom conductive layer to form first openings during said etching the sacrificial layers;
forming a gate dielectric layer on side surfaces of the at least one of the top conductive layer and the bottom conductive layer in the first openings, and on the reference conductor in the first openings; and
forming spacers on side surfaces of the sacrificial layers and on the gate dielectric layer on side surfaces of the at least one of the top conductive layer and the bottom conductive layer, prior to said etching the reference conductor in the first openings.

15. The method of claim 14, comprising:
forming a memory layer on the spacers in the horizontal openings, prior to said forming a plurality of stacks of conductive strips in the horizontal openings,
wherein side surfaces of conductive strips in the plurality of stacks contact the memory layer.

16. The method of claim 14, comprising:
forming a silicide layer on side surfaces of the at least one of the top conductive layer and the bottom conductive layer in the second openings, and on a top surface of the reference conductor in the second openings.

17. The method of claim 10, comprising:
forming a memory layer on side surfaces of the sacrificial layers in the first openings; and
forming spacers on the memory layer in the first openings, prior to said etching the reference conductor in the first openings,
wherein side surfaces of conductive strips in the plurality of stacks contact the memory layer.

* * * * *